United States Patent
Blanchard

(10) Patent No.: US 7,586,165 B2
(45) Date of Patent: Sep. 8, 2009

(54) MICROELECTROMECHANICAL SYSTEMS (MEMS) DEVICE INCLUDING A SUPERLATTICE

(75) Inventor: Richard A. Blanchard, Los Altos, CA (US)

(73) Assignee: MEARS Technologies, Inc., Waltham, MA (US)

( * ) Notice: Subject to any disclaimer, the term of this patent is extended or adjusted under 35 U.S.C. 154(b) by 388 days.

(21) Appl. No.: 11/421,234

(22) Filed: May 31, 2006

(65) Prior Publication Data

US 2006/0226502 A1 Oct. 12, 2006

Related U.S. Application Data

(63) Continuation-in-part of application No. 10/992,422, filed on Nov. 18, 2004, now Pat. No. 7,071,119, which is a continuation of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003, now abandoned.

(60) Provisional application No. 60/685,996, filed on May 31, 2005.

(51) Int. Cl.
*H01L 29/84* (2006.01)

(52) U.S. Cl. .......................... 257/415; 257/420; 257/15; 257/E27.006

(58) Field of Classification Search ................ 257/415, 257/416, 420, 9, 15, 18, 28, E33.01, E33.009, 257/E33.035, E29.072, E29.073, E29.074, 257/E29.077, E27.006, E29.298
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |

(Continued)

FOREIGN PATENT DOCUMENTS

EP 0 843 361 5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Thinh T Nguyen
(74) *Attorney, Agent, or Firm*—Allen, Dyer, Doppelt, Milbrath & Gilchrist, P.A.

(57) ABSTRACT

A microelectromechanical system (MEMS) device may include a substrate and at least one movable member supported by the substrate. The at least one movable member may include a superlattice including a plurality of stacked groups of layers with each group of layers of the superlattice comprising a plurality of stacked base semiconductor monolayers defining a base semiconductor portion, and at least one non-semiconductor monolayer constrained within a crystal lattice of adjacent base semiconductor portions.

14 Claims, 27 Drawing Sheets

U.S. PATENT DOCUMENTS

| | | | | |
|---|---|---|---|---|
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,357,119 | A | 10/1994 | Wang et al. | 257/18 |
| 5,393,375 | A | 2/1995 | MacDonald et al. | 156/643 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 * | 4/2002 | Wang et al. | 438/478 |
| 6,436,784 | B1 | 8/2002 | Allam | 438/380 |
| 6,472,685 | B2 | 10/2002 | Takagi | 257/77 |
| 6,498,359 | B2 | 12/2002 | Schmidt et al. | 257/190 |
| 6,501,092 | B1 | 12/2002 | Nikonov et al. | 257/29 |
| 6,521,519 | B2 | 2/2003 | Kamath et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 6,875,936 | B1 * | 4/2005 | Suzuki et al. | 200/181 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |

FOREIGN PATENT DOCUMENTS

| | | |
|---|---|---|
| EP | 1150318 | 10/2001 |
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |
| WO | WO2005034245 | 4/2005 |

OTHER PUBLICATIONS

Tsu, *Phenomena in Silicon Nanostructure Devices*, University of North Carolina at Charlotte, Sep. 6, 2000.

Ye et al., *GaAs Mosfet with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

* cited by examiner

US 7,586,165 B2

MICROELECTROMECHANICAL SYSTEMS (MEMS) DEVICE INCLUDING A SUPERLATTICE

CROSS-REFERENCE TO RELATED APPLICATIONS

This application claims the benefit of U.S. Provisional Application No. 60/685,996, filed May 31, 2005, and is a continuation-in-part of U.S. patent application Ser. No. 10/992,422 filed Nov. 18, 2004, now U.S. Pat. No. 7,071,119 which is a continuation of U.S. patent application Ser. No. 10/647,060 filed Aug. 22, 2003, now U.S. Pat. No. 6,958,486, which is a continuation-in-part of U.S. patent application Ser. Nos. 10/603,696 and 10/603,621 filed on Jun. 26, 2003, now abandoned the entire disclosures of which are incorporated by reference herein.

FIELD OF THE INVENTION

The present invention relates to the field of semiconductors, and, more particularly, to semiconductor devices comprising superlattices and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

SUMMARY OF THE INVENTION

A microelectromechanical system (MEMS) device may include a substrate and at least one movable member supported by the substrate. Furthermore, the at least one movable member may include a superlattice including a plurality of stacked groups of layers with each group of layers of the superlattice comprising a plurality of stacked base semiconductor monolayers defining a base semiconductor portion, and at least one non-semiconductor monolayer constrained within a crystal lattice of adjacent base semiconductor portions.

More particularly, the superlattice may be a piezoelectric superlattice. The MEMS device may further include a driver carried by the substrate for driving the at least one movable member. Also, a first electrically conductive contact may be carried by the at least one movable member, and a second electrically conductive contact may be carried by the substrate and aligned with the first electrically conductive contact.

The MEMS device may further include a first radio frequency (RF) signal line connected to the first electrically conductive contact, and a second RF signal line connected to the second electrically conductive contact. In addition, a pair of bias voltage contacts may be included for applying a bias voltage to the superlattice for moving the at least one movable member. Furthermore, portions of the superlattice may be spaced apart from the substrate. Also, the MEMS device may further include a dielectric anchor carried by the substrate, and the at least one movable member may be supported by the dielectric anchor.

With respect to the superlattice, the base semiconductor may include silicon, and the at least one non-semiconductor monolayer may include oxygen, for example. More particularly, the at least one non-semiconductor monolayer may include a non-semiconductor selected from the group consisting essentially of oxygen, nitrogen, fluorine, and carbon-oxygen Further, at least one non-semiconductor monolayer may be a single monolayer thick. All of the base semiconductor portions may be a same number of monolayers thick, or at least some of the base semiconductor portions may be a different number of monolayers thick. Additionally, opposing base semiconductor portions in adjacent groups of layers of the at least one superlattice may be chemically bound together.

DETAILED DESCRIPTION OF THE PREFERRED EMBODIMENTS

Figure 1:
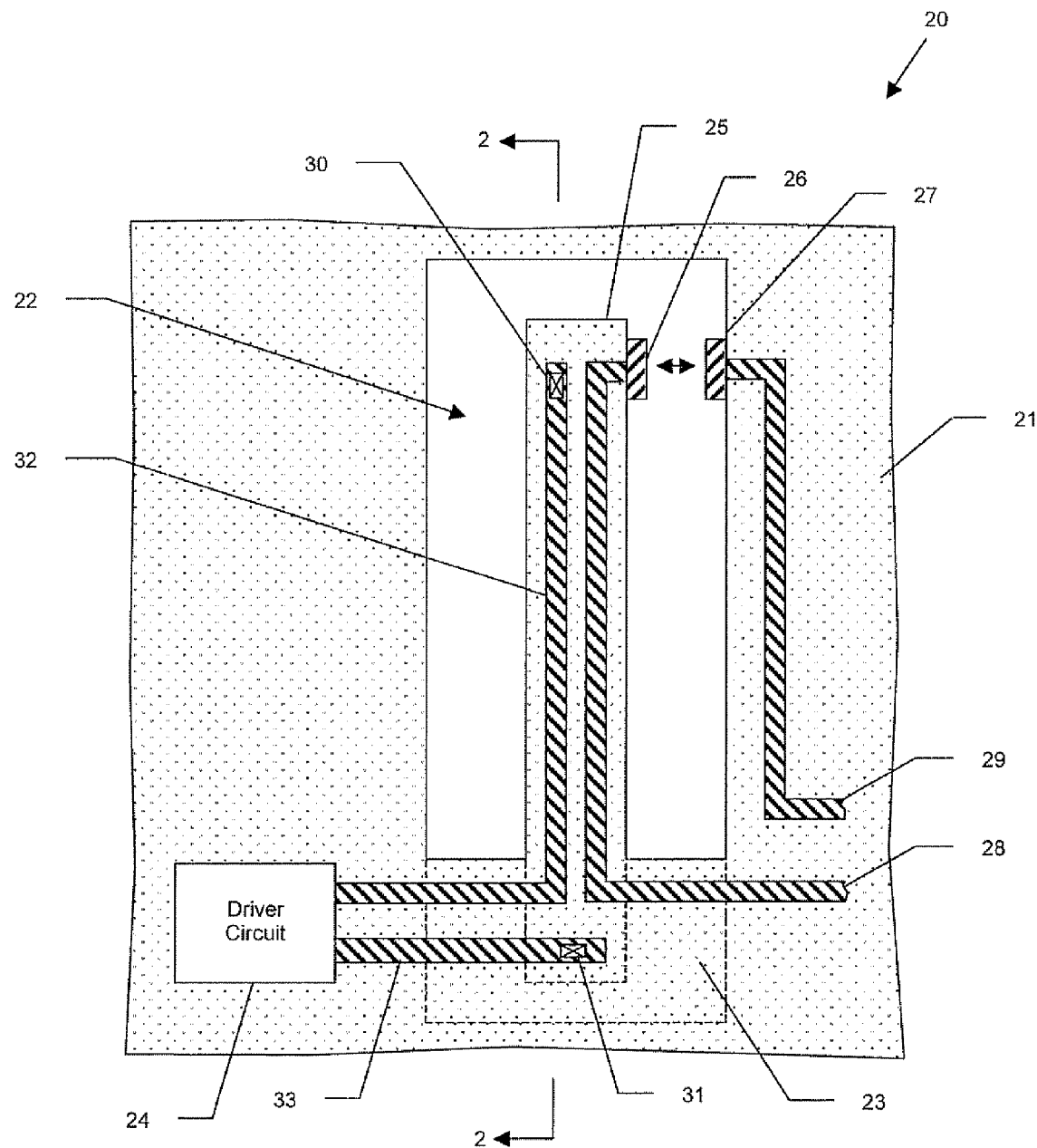
FIG. 1 is a top view of a microelectromechanical system (MEMS) device in accordance with the present invention including a superlattice.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments, The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{BZ} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{BZ} (1 - f(E(k,n), E_F, T)) d^3k}$$

for holes, where f is the Fermi-Dirac distribution, $E_F$ is the Fermi energy, T is the temperature (Kelvin), E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensors Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material (which will be discussed in further detail below) used in a microelectromechanical system (MEMS) device 20. Certain applications have developed wherein relatively small devices such as tunable capacitors, switches, etc, are desirably used. Such devices may advantageously be made using MEMS manufacturing processes in which very small movable components are formed on a substrate using a combination of deposition, plating or other additive processes, and selective etching, and/or other lift-off techniques.

Such techniques typically form a structure which is ultimately partially released or suspended to permit mechanical motion, typically as a result of an electrostatic force. The electrostatic force may be generated by applying an electrical voltage to spaced-apart conductors. One common MEMS structure is a switch provided by a conductive beam anchored at one end and with an opposite end that can be brought into engagement with an adjacent contact via an applied electrostatic force.

An article by Los Santo et al. entitled "RF MEMS for Ubiquitous Wireless Connectivity: Part 1-Fabrication," IEEE Microwave Magazine, December 2004, discusses various applications for MEMS devices, and is hereby incorporate herein by reference in its entirety. This article states that MEMS technology may be applied to radio-frequency (RF)/microwave systems, as RF MEMS may provide passive devices such as switches, switchable (two-state) capacitors, tunable capacitors (varactors), inductors, transmission lines and resonators. As such, these devices may be used in wireless appliances operating in the home/ground, mobile, and space spheres, such as handsets, base stations, and satellites An exemplary MEMS device 20 (i.e., a switch) including the superlattice 25 is first described with reference to FIGS. 1 and 2. It should be noted that while a preferred embodiment of a MEMS switch is described herein, the superlattice 25 may advantageously be used in numerous types of MEMS devices, including those mentioned above, as will be appreciated by those skilled in the art based upon the disclosure set forth herein As described in the Los Santos et al. article, one of the physical bases for actuating a MEMS is the inverse piezoelectric effect. When a voltage is applied across a piezoelectric layer, it causes a mechanical deformation of the layer. The resulting deformation can open a closed relay or close an open relay. The conventional approach to the manufacture of MEMS switches is to form a relay using a cantilever structure. Though such structures provide the desired functionality, their fabrication can be difficult.

In the MEMS device 20, the superlattice 25 is electrically polled to be piezoelectric and provide a movable member for the MEMS device, as discussed above. In particular, the MEMS device 20 further illustratively includes a substrate 21, such as a semiconductor substrate (e.g., silicon, SOI, etc.). A trench 22 is formed in the substrate 21 around and underneath the superlattice 25 so that portions of the superlattice are spaced apart from the substrate (i.e., the underside thereof), and a dielectric anchor 23 anchors the superlattice to the substrate above the bottom of the trench as shown. Of course, other arrangements may also be used, as will be appreciated by those skilled in the art.

The MEMS device 20 further illustratively includes a driver circuit 24 carried by the substrate 21 for driving the superlattice 25, i.e., the movable member. In the illustrated MEMS switch embodiment, a first electrically conductive contact 26 is illustratively carried by the movable member, and a second electrically conductive contact 27 is illustratively carried by the substrate 21 and aligned with the first electrically conductive contact as shown (FIG. 1). In addition, a first signal line 28, such as an RF signal line, for example, is connected to the first electrically conductive contact 26, and a second signal line 29 (which may also be an RF signal line) is illustratively connected to the second electrically conductive contact 27.

A pair of bias voltage contacts 30, 31 are coupled to the superlattice 25 for applying a bias voltage thereto for moving the movable member. In particular, the bias voltage contacts 30, 31 may be electrically conductive vias formed in the superlattice 25 as shown, although surface contacts or metallizations may also be used in some embodiments. Electrically conductive traces/metallizations 32, 33 respectively connect the bias voltage contacts 30, 31 to positive and negative connectors of the driver circuit 24. As such, when the driver circuit 24 applies a bias voltage to the superlattice 25 via the bias voltage contacts 30, 31, this causes a mechanical deformation of the superlattice, which in turn causes the movable member to move the first electrical contact 26 toward the second electrical contact 27, as shown by the two-headed arrow in FIG. 1. This advantageously closes the switch and allows a signal (e.g., an RF signal) to be conducted between the first and second signal lines 28, 29. Moreover, when the bias voltage is removed, the movable member moves the first contact 26 away from the second contact 27 so that the switch is opened, as will be appreciated by those skilled in the art.

An oxide layer 34 (FIG. 2) is formed over the entire superlattice semiconductor region, and is preferentially removed where contact to the superlattice material is desired. It should be noted that in the illustrated embodiment the trench 22 and sides/bottom of the movable member are shown as being unpassivated. However, it is possible to form a dielectric layer, such as $SiO_2$, on the exposed semiconductor material if desired in some embodiments, as will be appreciated by those skilled in the art.

Figure 3:
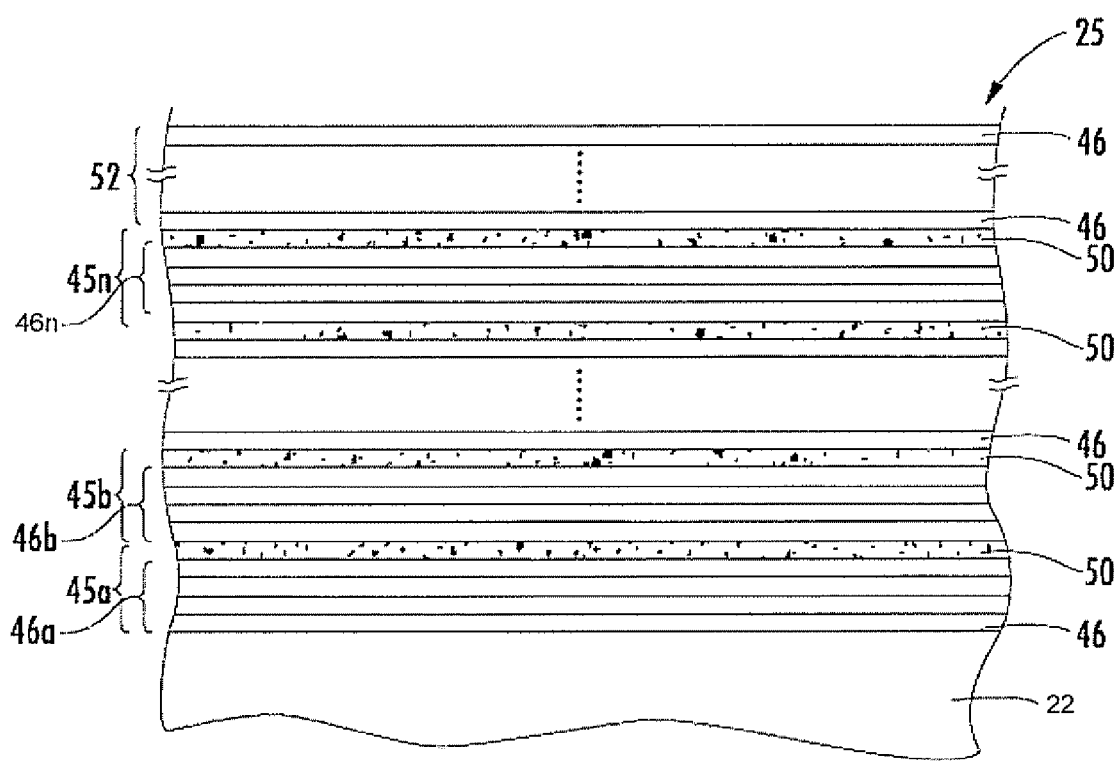
FIG. 3 is a greatly enlarged schematic cross-sectional view of the superlattice as shown in FIG. 1.
Figure 4:
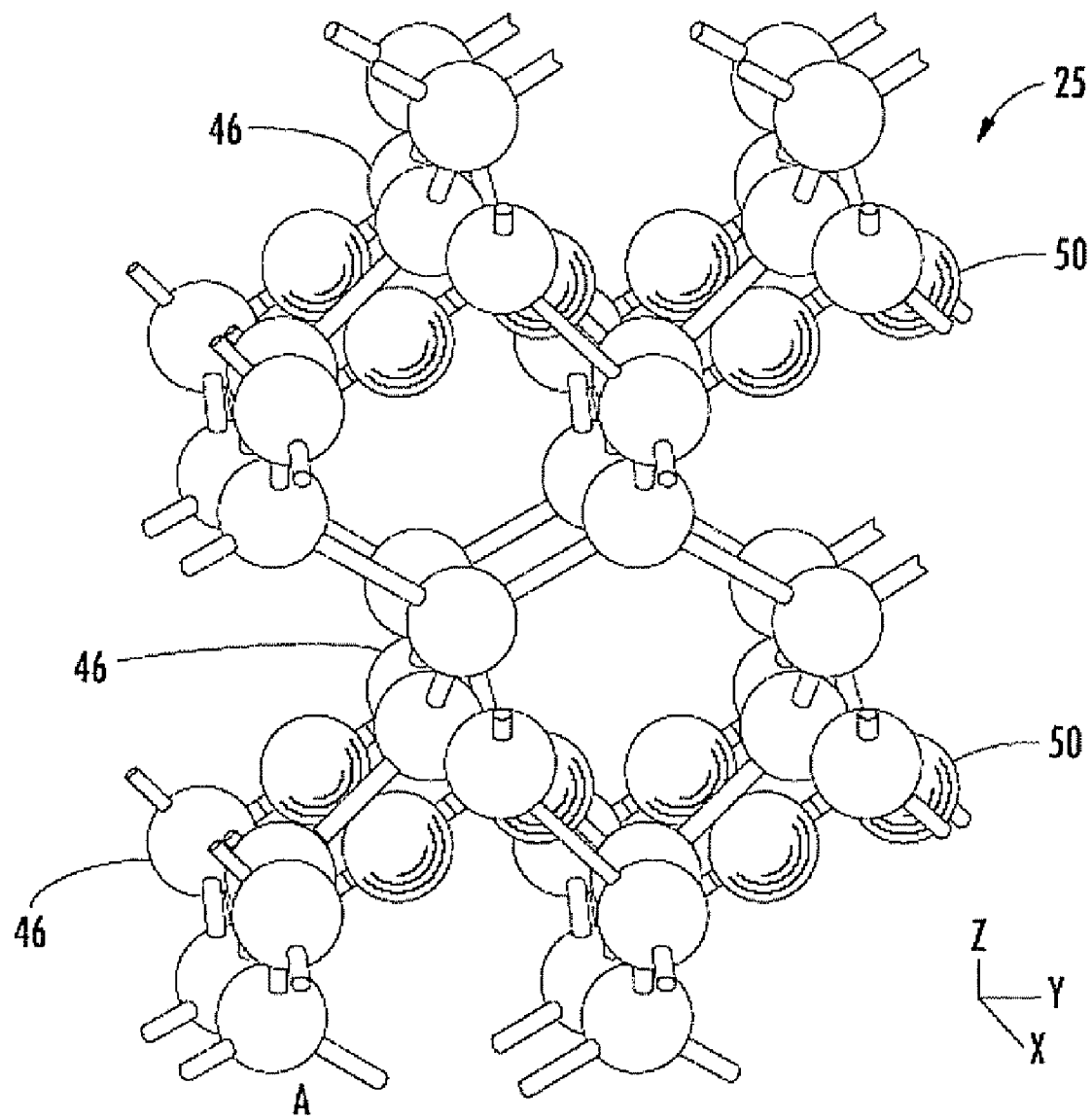
FIG. 4 is a perspective schematic atomic diagram of a portion of the superlattice shown in FIG. 3.

Referring now additionally to FIGS. 3 and 4, the superlattice 25 has a structure that is controlled at the atomic or molecular level and may be formed using known techniques of atomic or molecular layer deposition. The superlattice 25 includes a plurality of layer groups 45a-45n arranged in stacked relation, as noted above, as perhaps best understood with specific reference to the schematic cross-sectional view of FIG. 3.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 3 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice. Moreover, this structure also advantageously provides a barrier to dopant and/or material bleed or diffusion between layers vertically above and below the superlattice 25. In addition, it is theorized without wishing to be bound thereto that the superlattice 25 may be electrically polled so that it is piezoelectric, as will be appreciated by those skilled in the art.

It is also theorized that the superlattice 25 provides a higher charge carrier mobility based upon the lower conductivity effective mass than would otherwise be present. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

A cap layer 52 is on an upper layer group 45n of the superlattice 25. The cap layer 52 may comprise a plurality of base semiconductor monolayers 46. The cap layer 52 may have between 2 to 100 monolayers of the base semiconductor, and, more preferably between 10 to 50 monolayers. Other thicknesses may be used as well.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing In other embodiments, the non-semiconductor may be another inorganic or organic element or compound that is compatible with the given semiconductor processing, as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIG. 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/C superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. It may be appropriate to dope the superlattice 25 as well. It should be noted, however, that one or more groups of layers 45 of the superlattice 25 may remain substantially undoped depending upon the particular type of MEMS device that is being implemented as well as the position of the superlattice within the device, as will be appreciated by those skilled in the art.

Figure 5:
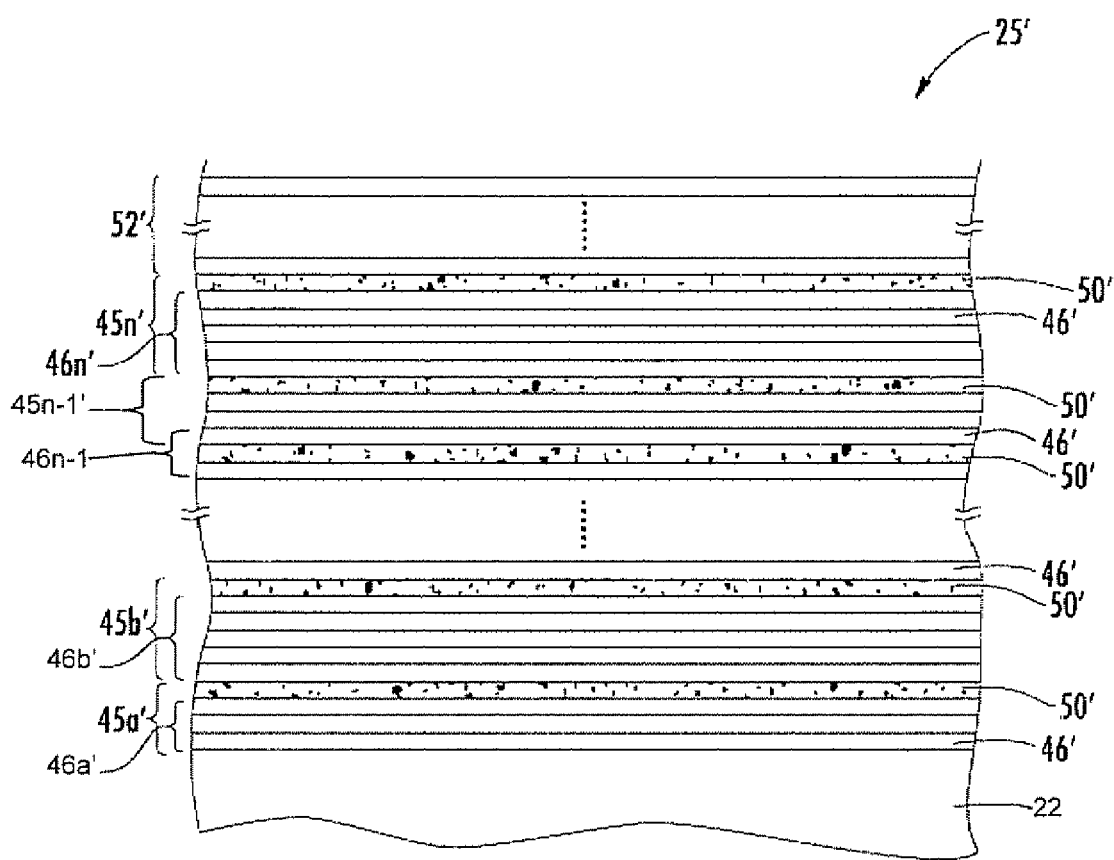
FIG. 5 is a greatly enlarged schematic cross-sectional view of another embodiment of a superlattice that may be used in the device of FIG. 1.

Referring now additionally to FIG. 5, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 5 not specifically mentioned are similar to those discussed above with reference to FIG. 3 and need no further discussion herein.

In some device embodiments, all of the base semiconductor portions 46a-46n of a superlattice 25 may be a same number of monolayers thick. In other embodiments, at least some of the base semiconductor portions 46a-46n may be a different number of monolayers thick. In still other embodiments, all of the base semiconductor portions 46a-46n may be a different number of monolayers thick.

Figure 6A:
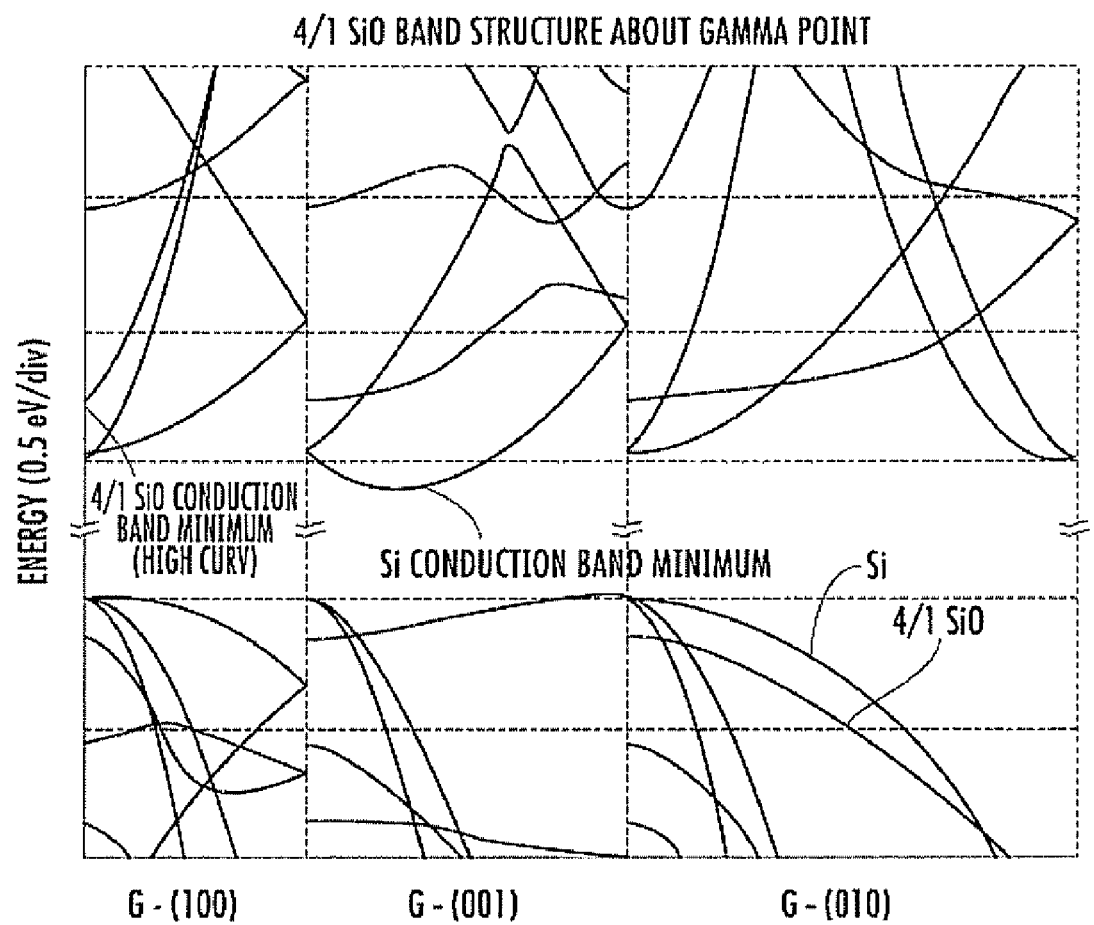
FIG. 6A is a graph of the calculated band structure from the gamma point (G) for both bulk silicon as in the prior art, and for the 4/1 Si/O superlattice as shown in FIG. 2.
Figure 6B:
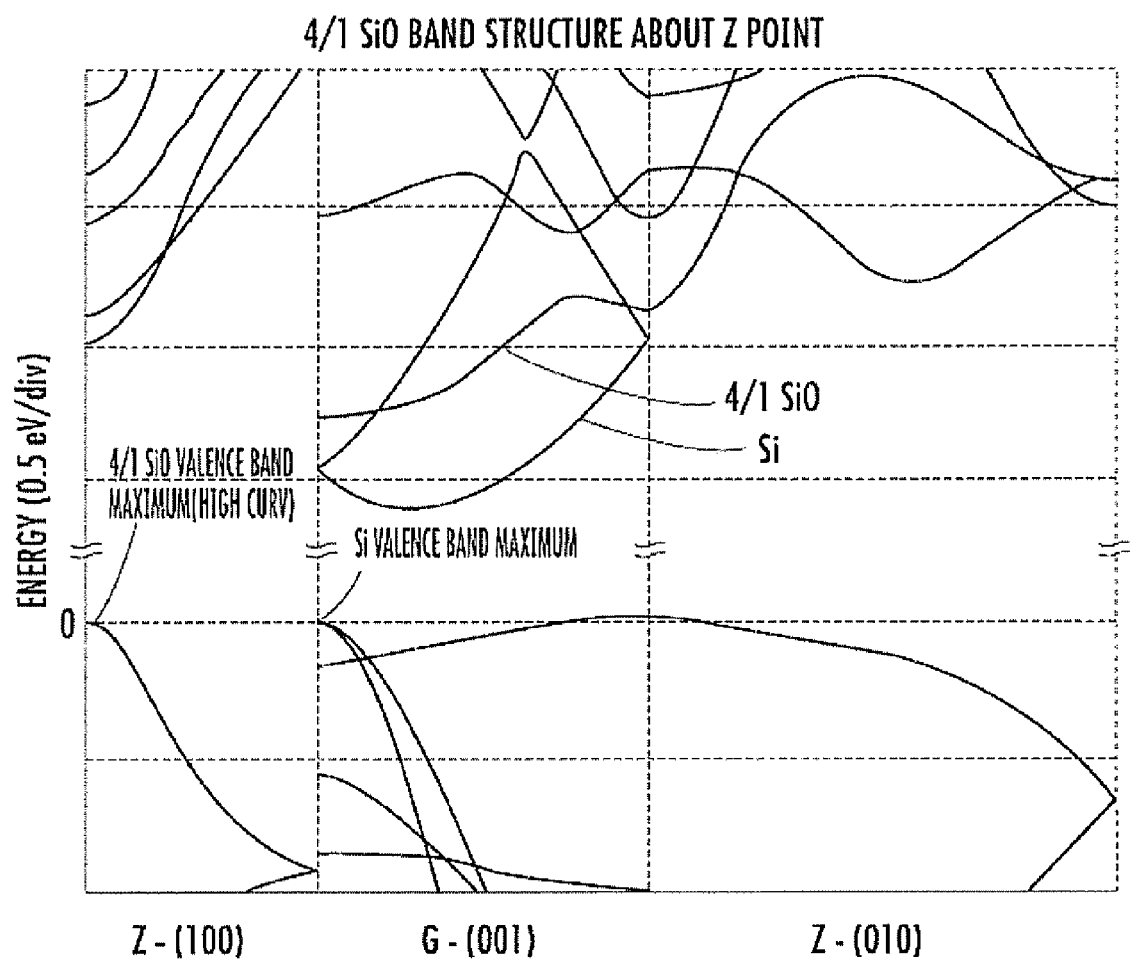
FIG. 6B is a graph of the calculated band structure from the Z point for both bulk silicon as in the prior art, and for the 4/1 Si/O superlattice as shown in FIG. 1.
Figure 6C:
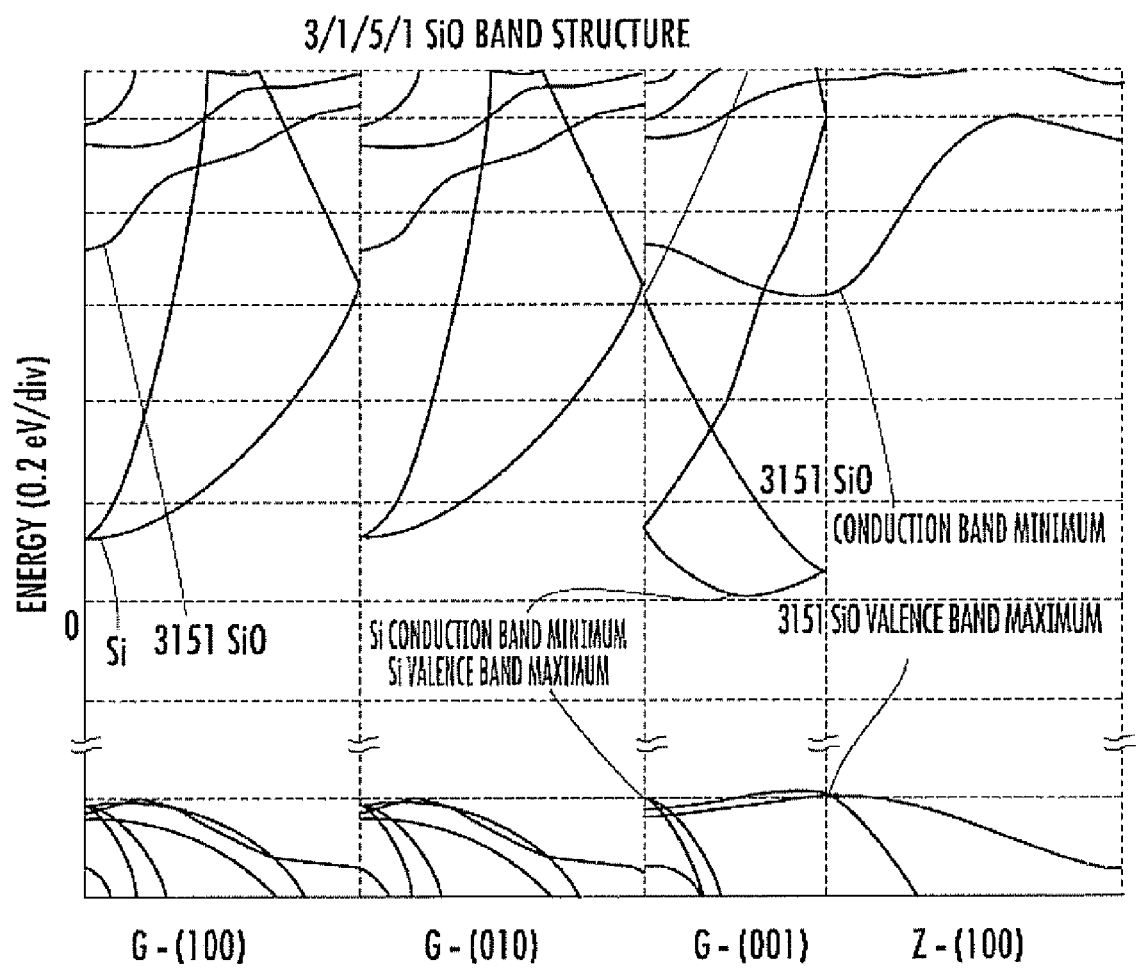
FIG. 6C is a graph of the calculated band structure from both the gamma and Z points for both bulk silicon as in the prior art, and for the 5/1/3/1 Si/O superlattice as shown in FIG. 5.
Figure 7A:
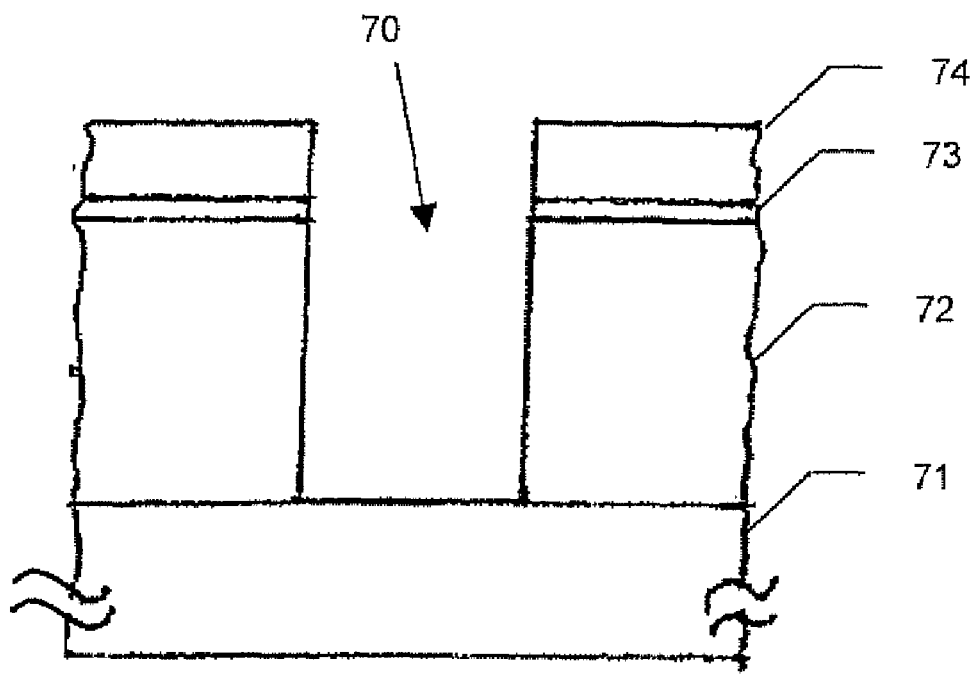
FIGS. 7A-7F are a series of cross-sectional views illustrating a method for making superlattices for use in a MEMS device in accordance with the invention.
Figure 7B:
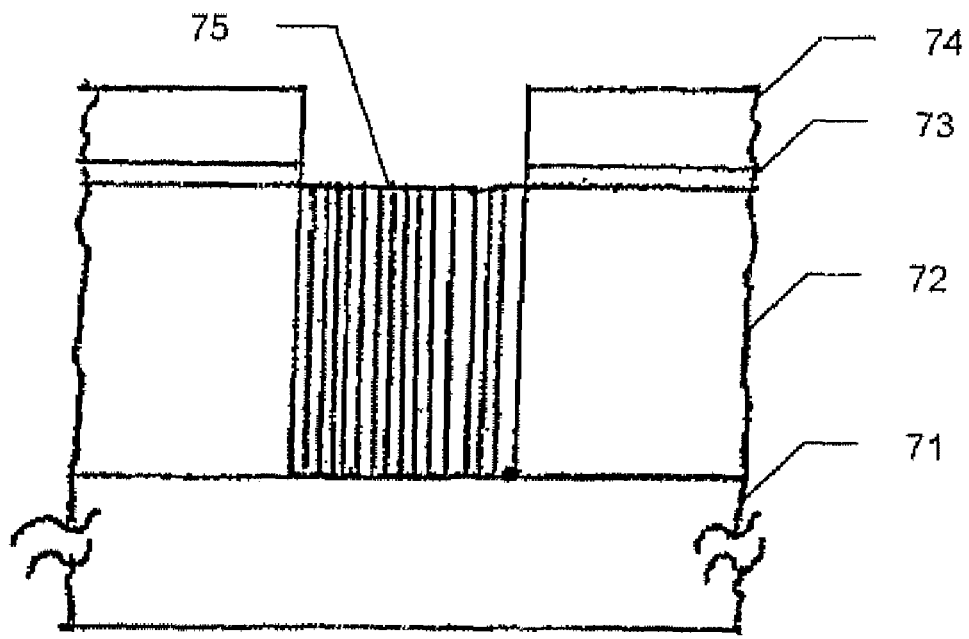
Figure 7C:
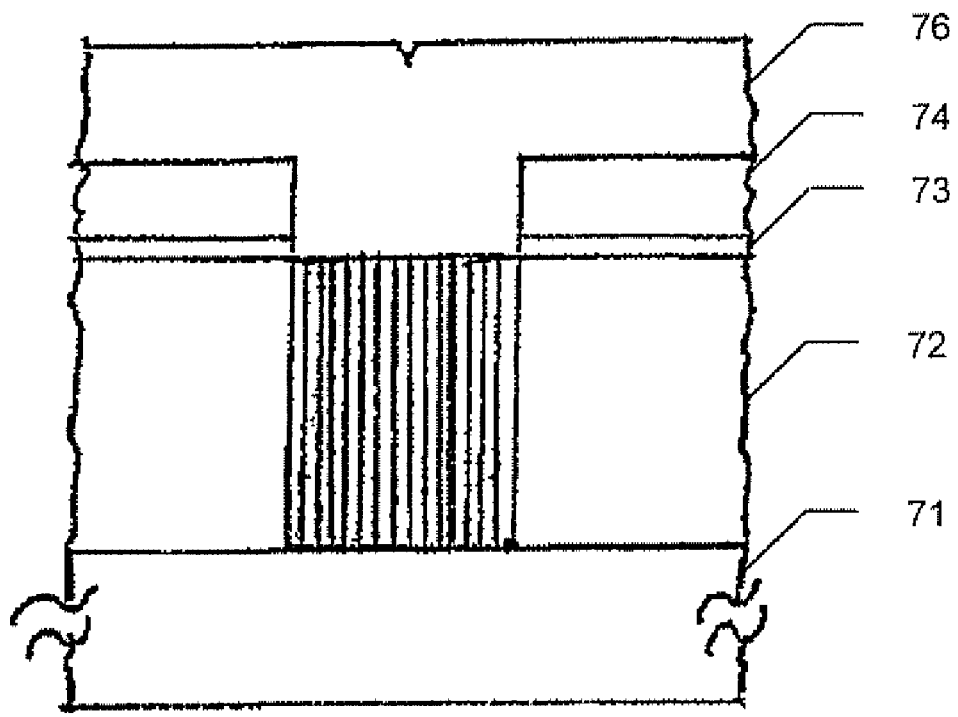
Figure 7D:
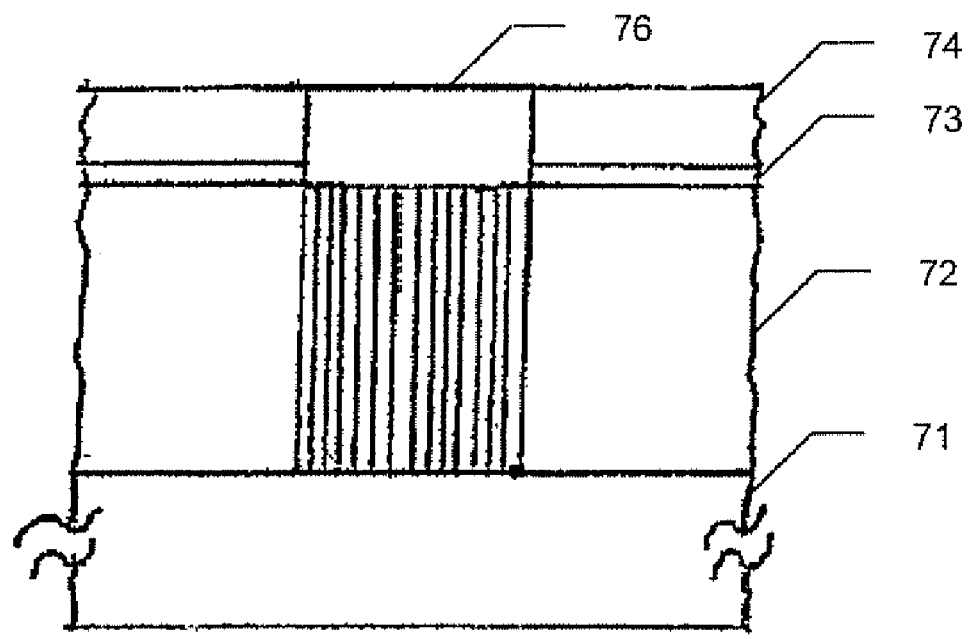
Figure 7E:
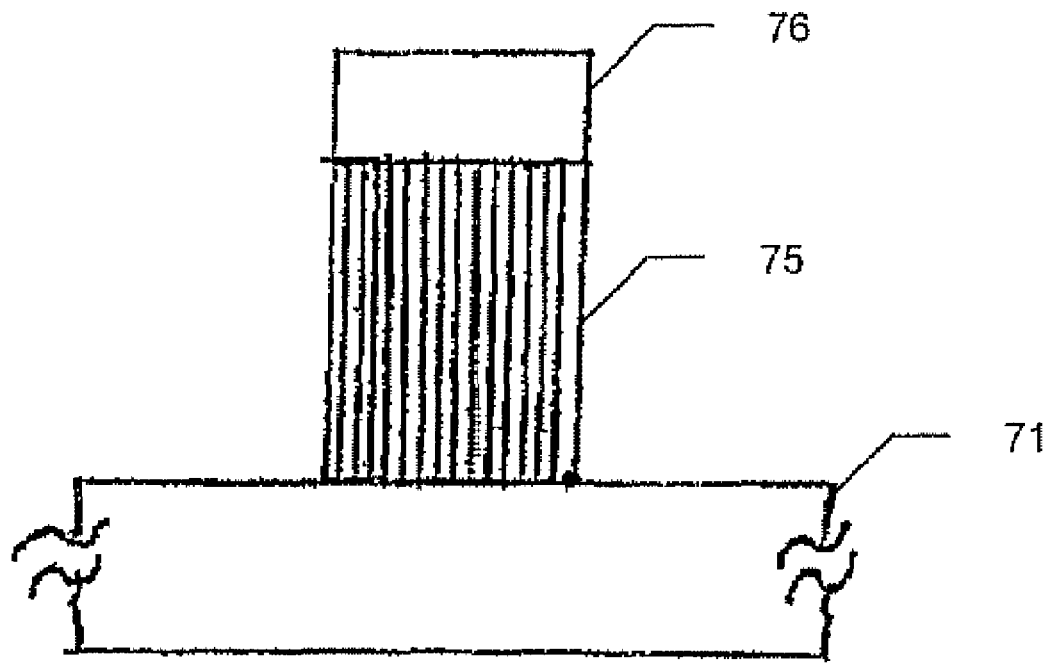
Figure 7F:
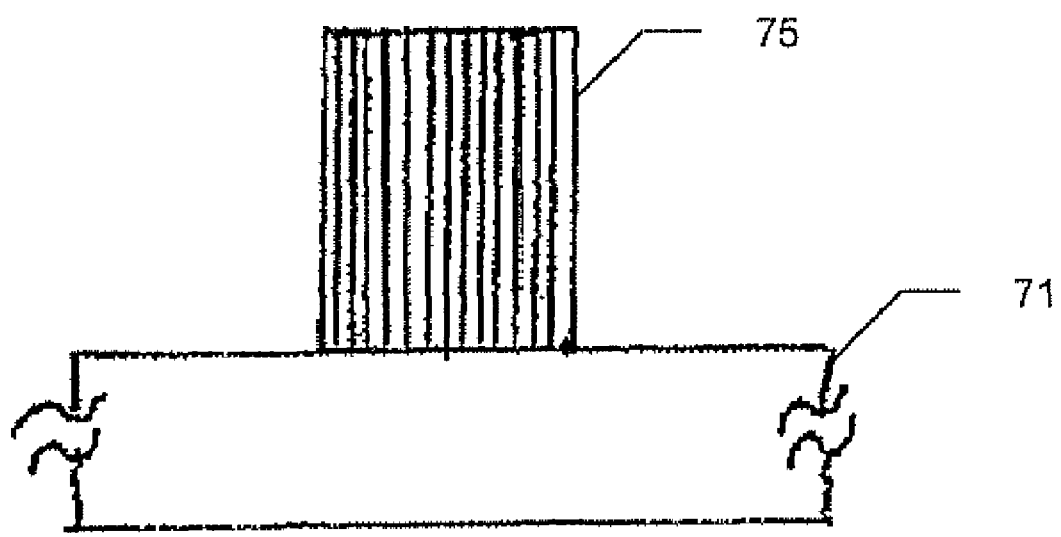

In FIGS. 6A-6C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 6A shows the calculated band structure from the gamma point (G) for both bulk silicon (represented by continuous lines) and for the 4/1 Si/O superlattice 25 as shown in FIG. 3 (represented by dotted lines) The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 6B shows the calculated band structure from the Z point for both bulk silicon (continuous lines) and for the 4/1 Si/O superlattice 25 (dotted lines) of FIG. 3. This figure illustrates the enhanced curvature of the valence band in the (100) direction.

FIG. 6C shows the calculated band structure from both the gamma and Z point for both bulk silicon (continuous lines) and for the 5/1/3/1 Si/O structure of the superlattice 25' of FIG. 5 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e., perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Applicant theorizes without wishing to be bound thereto that modifications to the lattice discussed in the above paragraphs produce a superlattice semiconductor material that has piezoelectric properties, unlike silicon, which is not piezoelectric.

Figure 2:
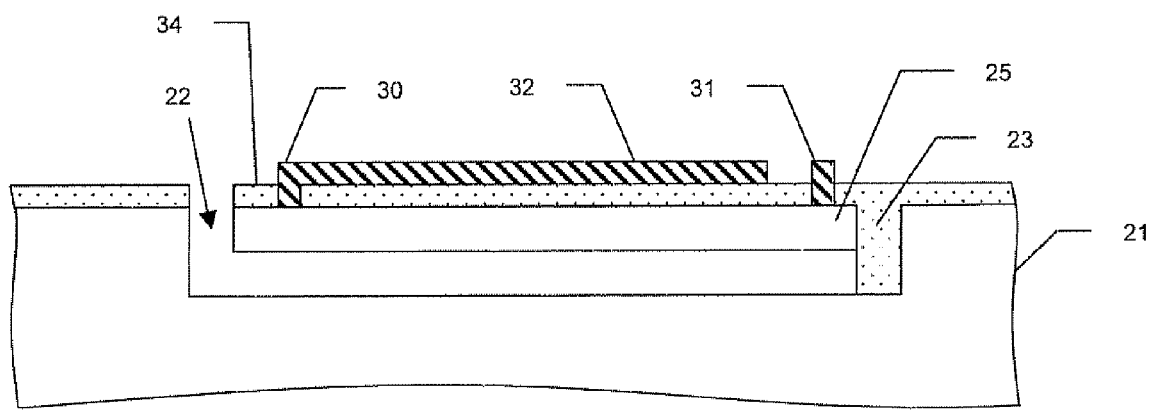
FIG. 2 is cross-sectional view of the MEMS device of FIG. 1 taken along line 2-2.

Various process flows for forming the superlattice 25 for use in MEMS devices will now be described. Generally speaking, the MEMS device 20 is fabricated by forming a piezoelectric region or film comprising the superlattice 25 along the sidewalls of a trench. After the film is formed and metallized, it is etched free of mechanical support (i.e., the trench 22 thereunder) except for one end, which in the embodiment illustrated in FIGS. 1 and 2 is carried by the dielectric anchor 23.

Turning to FIGS. 7A-7F, a first process flow is now described. This process sequence uses deposition steps to fill an etched trench 70 in a silicon-on-insulator (SOI) substrate. More particularly, the SOI substrate includes a dielectric (e.g., $SiO_2$) layer 71 and a semiconductor (e.g., silicon) layer 72 on the dielectric layer. A pad oxide layer 73 is formed on the semiconductor layer 72, after which a nitride (e.g., silicon nitride) layer 74 is deposited thereon, and photomasking and etch steps are performed to form the trench 70.

Next, a superlattice 75 (such as those described above) is selectively deposited on the walls of the trench 70. A dielectric 76, dielectric sandwich, or other trench fill material is then deposited over the superlattice 75 and the nitride layer 74, followed by a planarization step (FIG. 7D) that removes all material above the nitride layer The nitride layer 74 and pad oxide layer 73 are then removed by etching, followed by the semiconductor layer 72. The material used to fill the trench 70 (i.e., the dielectric 76) is then etched, at which point the substrate is ready for oxidation, contact formation, metallization, and release etching to form the above-described MEMS device 20 (or other MEMS devices).

Yet another flow process which similarly uses deposition steps to fill an etched trench is now described with reference to FIGS. 8A-8F. It should be noted that in these and the following series of flow diagrams discussed below, similar elements are indicated by increments of ten (e.g., the dielectric layer 71 is similar to the dielectric layer 81, 91, etc.). As such, these elements are only described upon the first occurrence thereof.

Figure 8A:
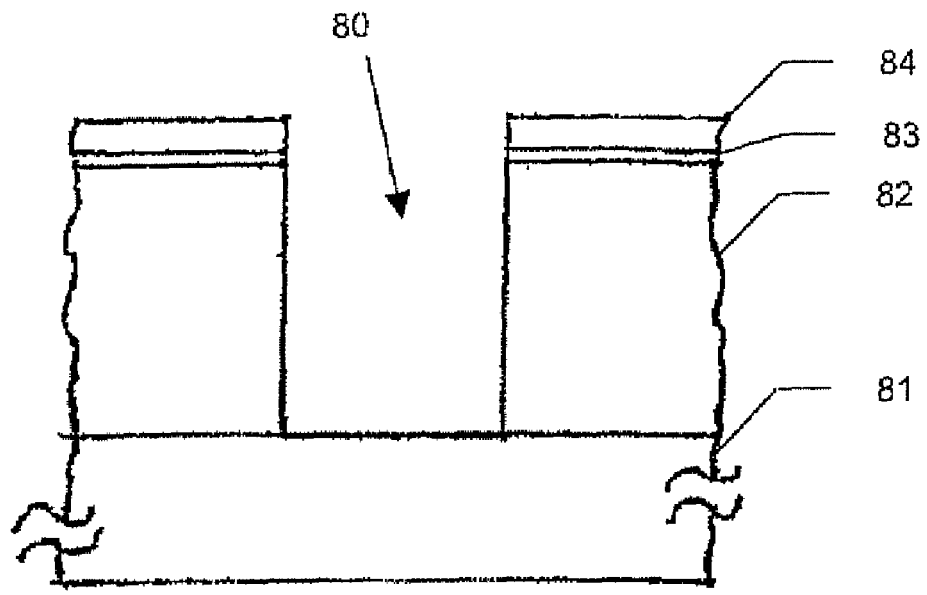
FIGS. 8A-8F are a series of cross-sectional views illustrating another method for making superlattices for use in a MEMS device in accordance with the invention.
Figure 8B:
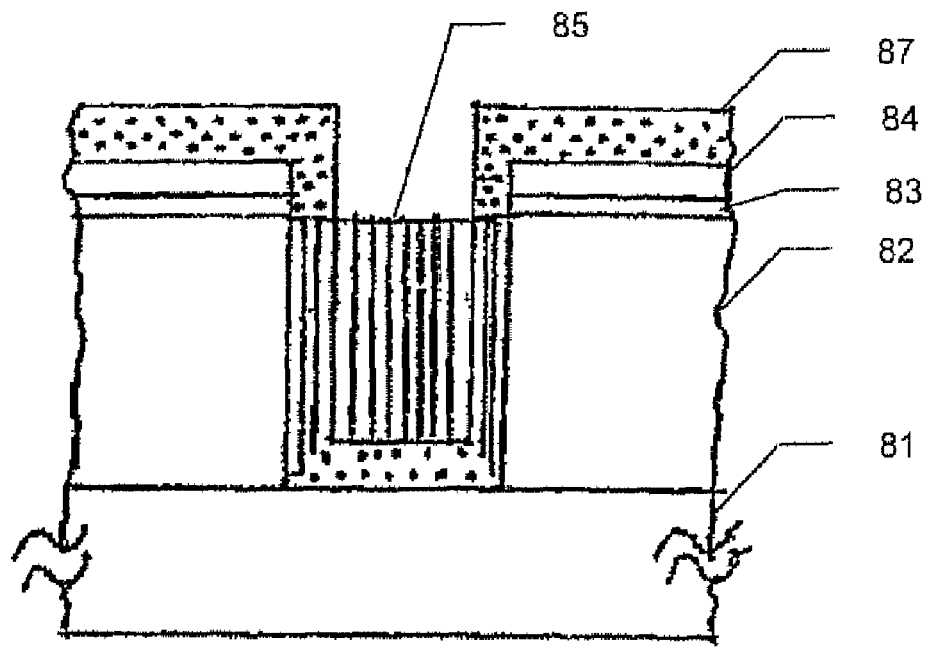
Figure 8C:
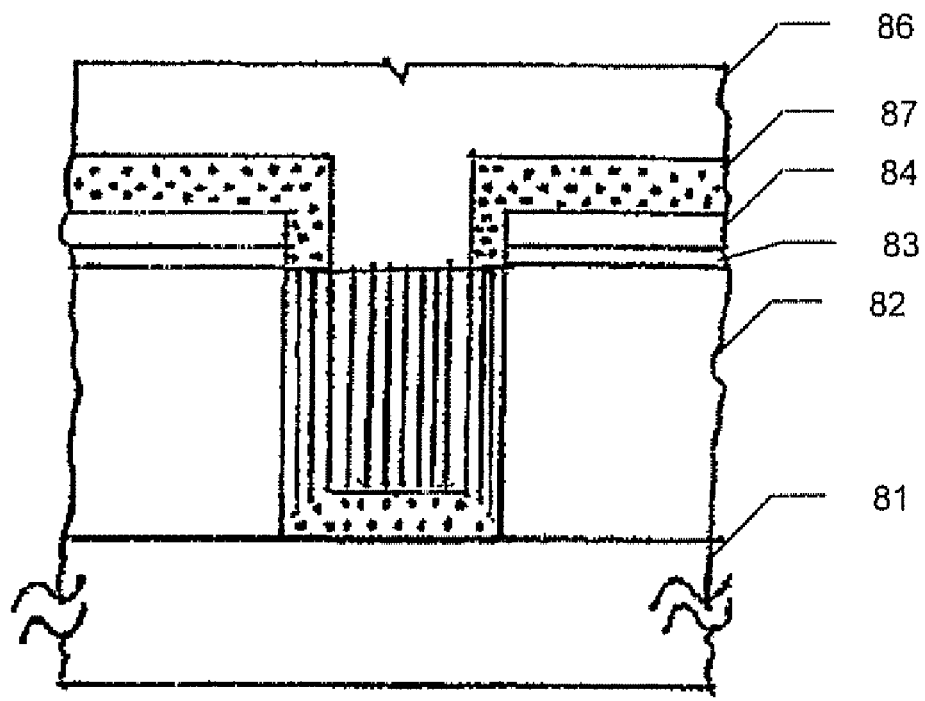
Figure 8D:
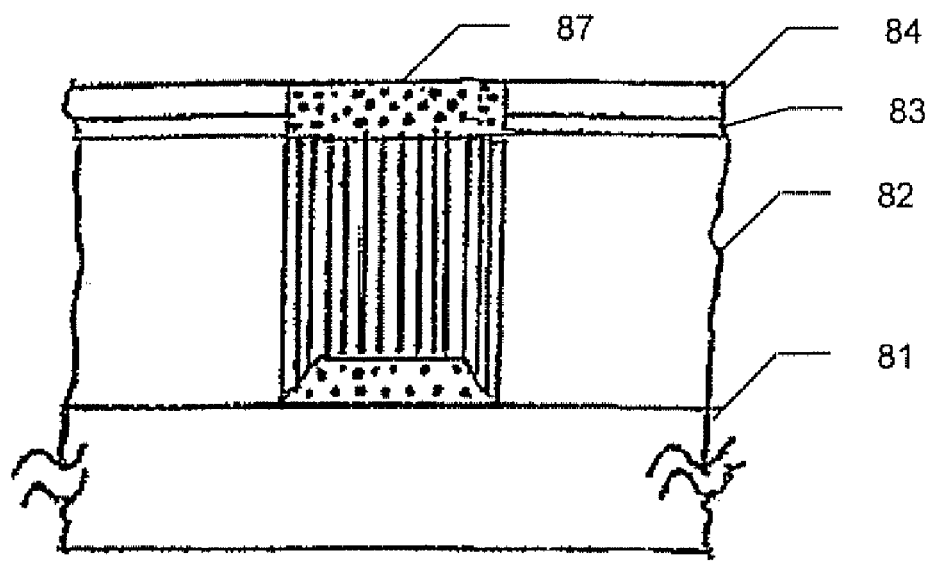
Figure 8E:
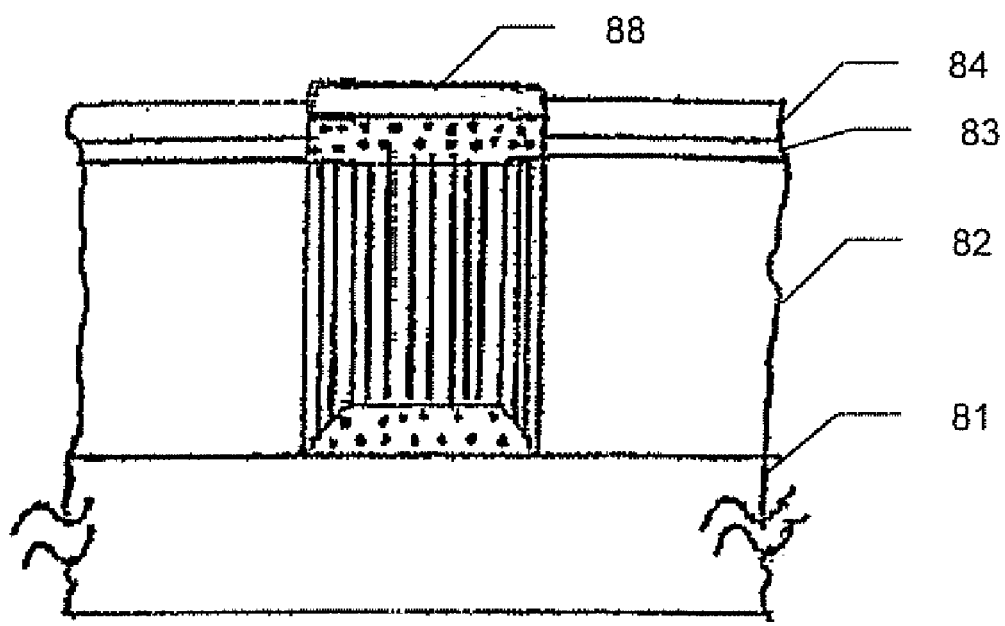
Figure 8F:
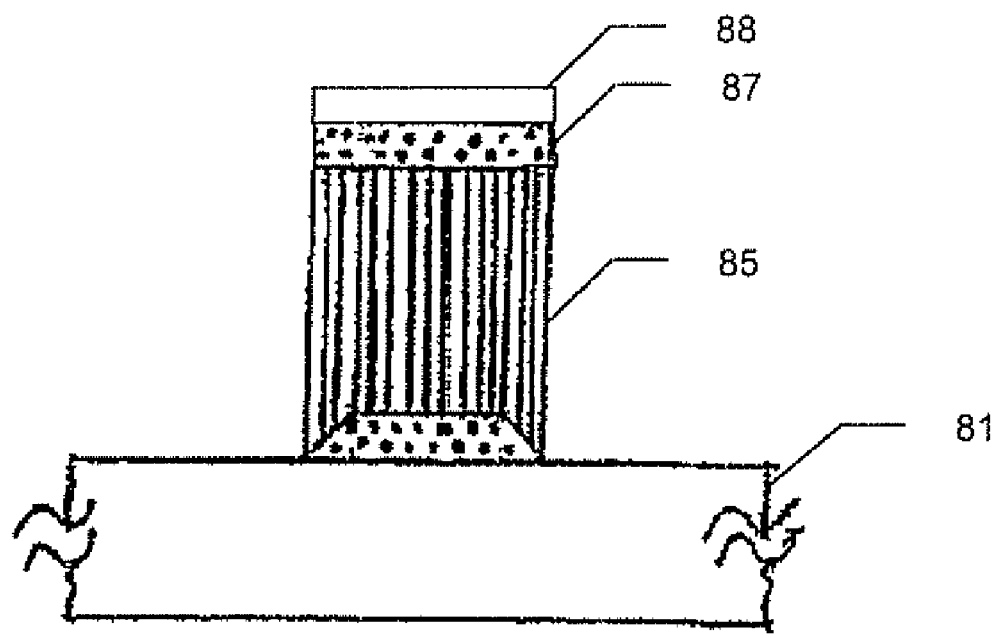
Figure 9A:
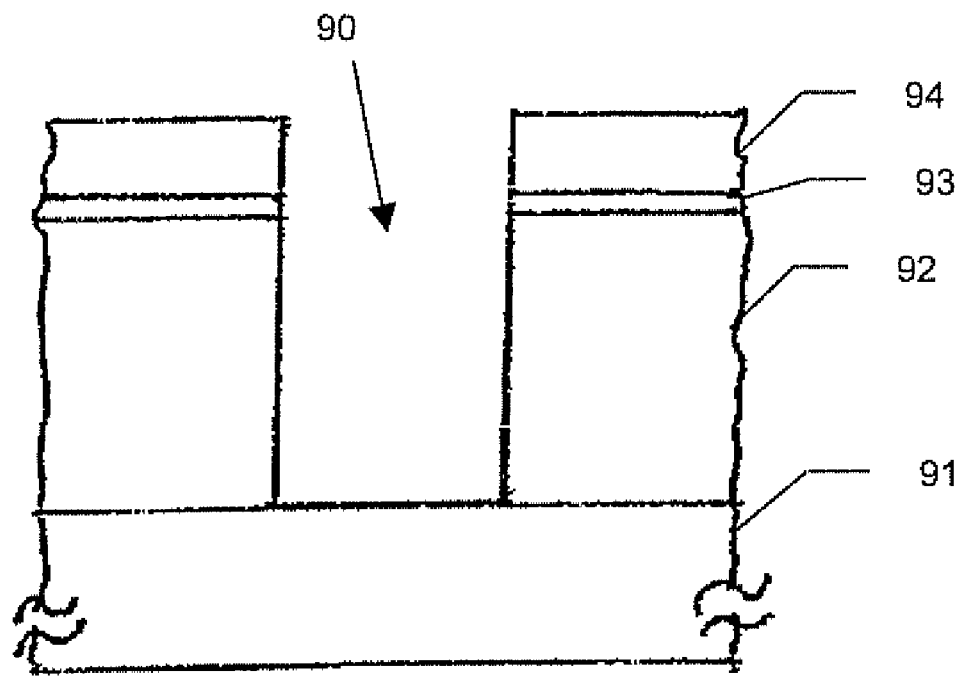
FIGS. 9A-9F are a series of cross-sectional views illustrating still another method for making superlattices for use in a MEMS device in accordance with the invention.
Figure 9B:
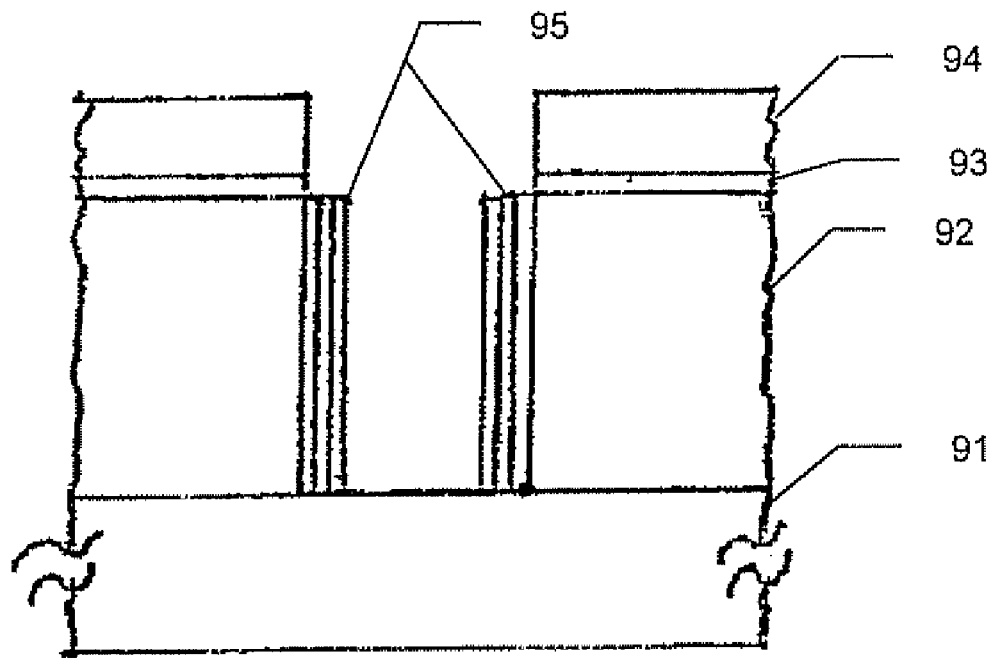
Figure 9C:
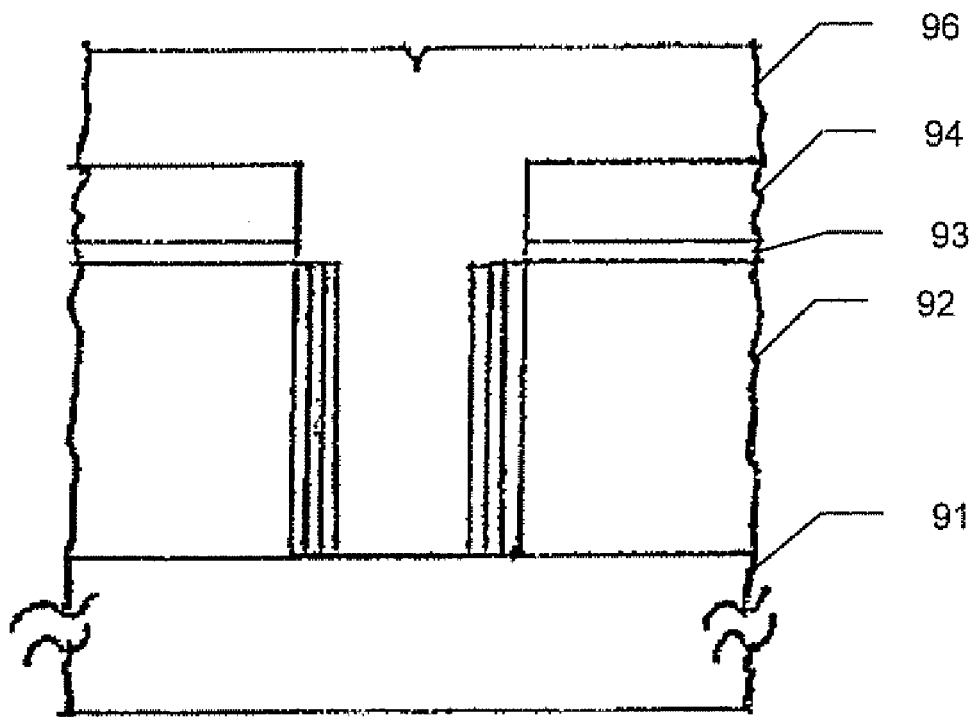
Figure 9D:
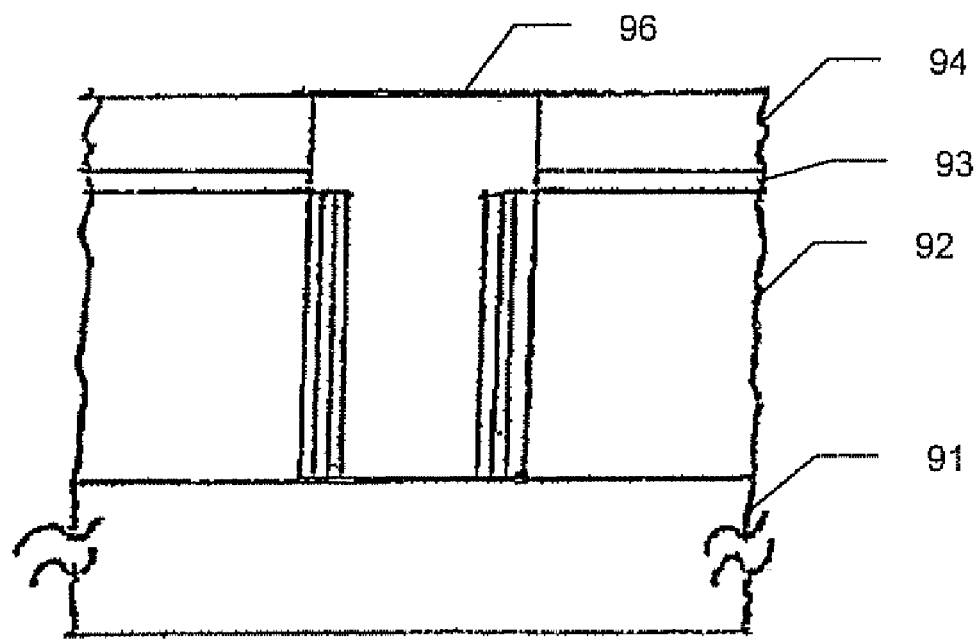
Figure 9E:
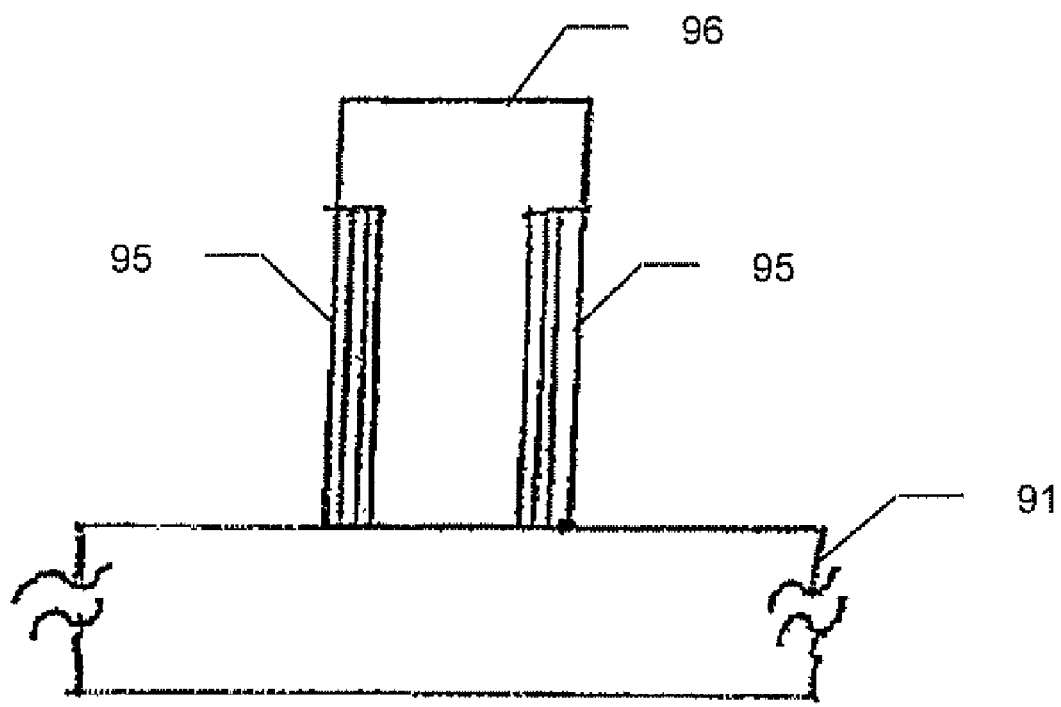
Figure 9F:
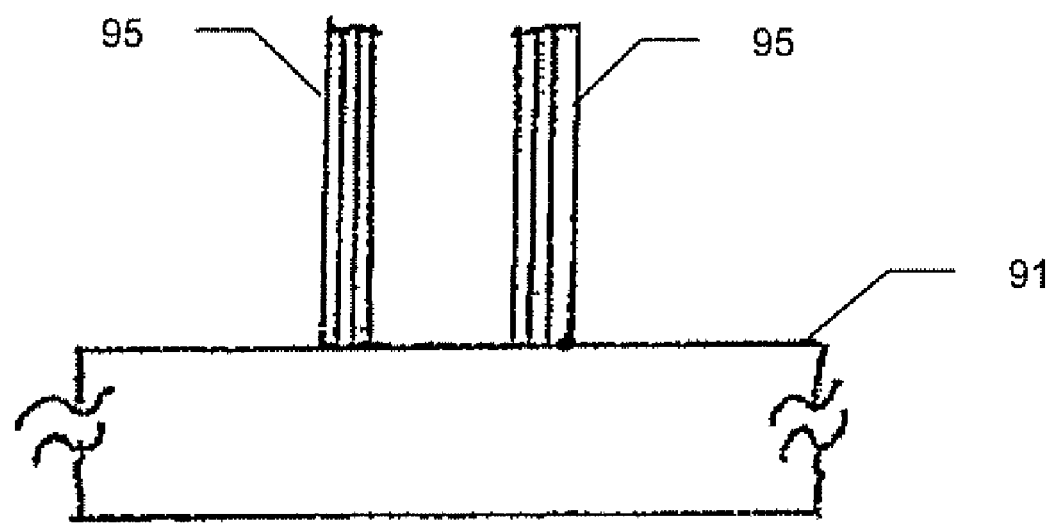

The process illustrated in FIGS. 8A-8F is similar to the above-described approach of FIGS. 7A-7F, except that during the superlattice 85 deposition single crystal superlattice semiconductor material is formed on the trench 80 walls, while polycrystalline superlattice semiconductor material 87 (which is shown with stippling for clarity of illustration) is formed on the trench bottom and the nitride layer 84. After trench filling and planarization steps (FIGS. 8C and 8D), portions of the polycrystalline silicon 87 are etched away, and the remainder thereof is oxidized to form an oxide layer 88 (FIG. 8E). The nitride layer 84 and pad oxide layer 83 are removed (i.e., etched). The substrate is then ready for contact formation, metallization and a release etch, as discussed above (FIG. 8F).

Four process flows that may be used to form a separate lateral piezoelectric cantilever superlattice structure along each sidewall of a trench are now described with reference to FIGS. 9-12. More particularly, the process illustrated in FIGS. 9A-9F is similar to the process illustrated in FIGS. 7A-7F, with the exception that the superlattice 95 is selectively deposited on the trench walls 90, as opposed to filling the entire trench.

Figure 10A:
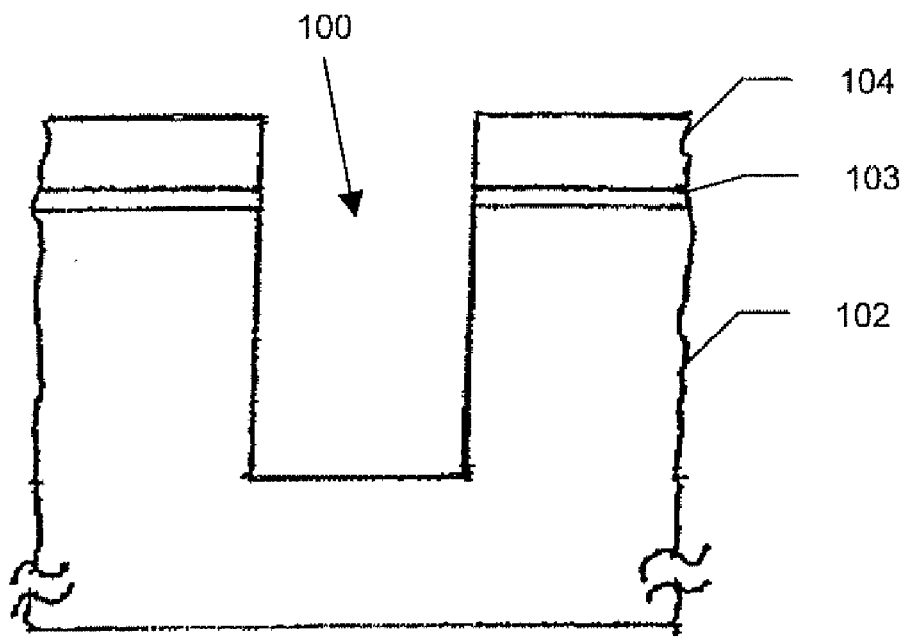
FIGS. 10A-10G are a series of cross-sectional views illustrating yet another method for making superlattices for use in a MEMS device in accordance with the invention.
Figure 10B:
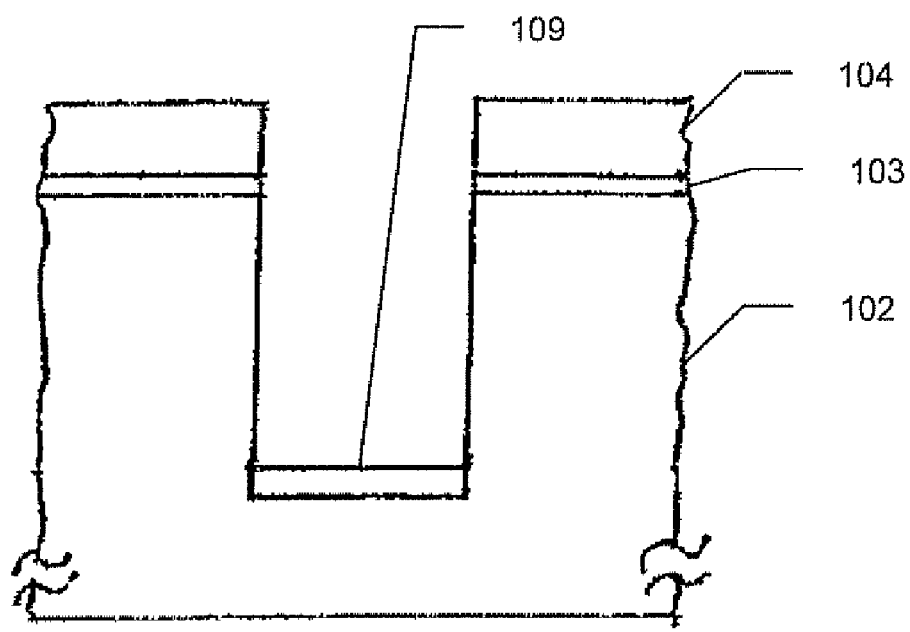
Figure 10C:
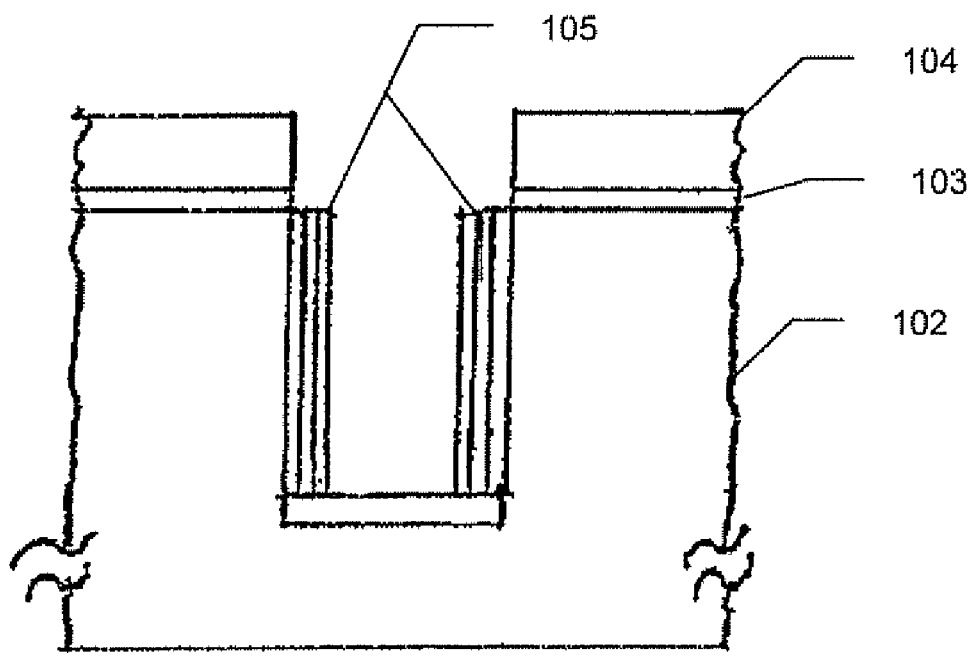
Figure 10D:
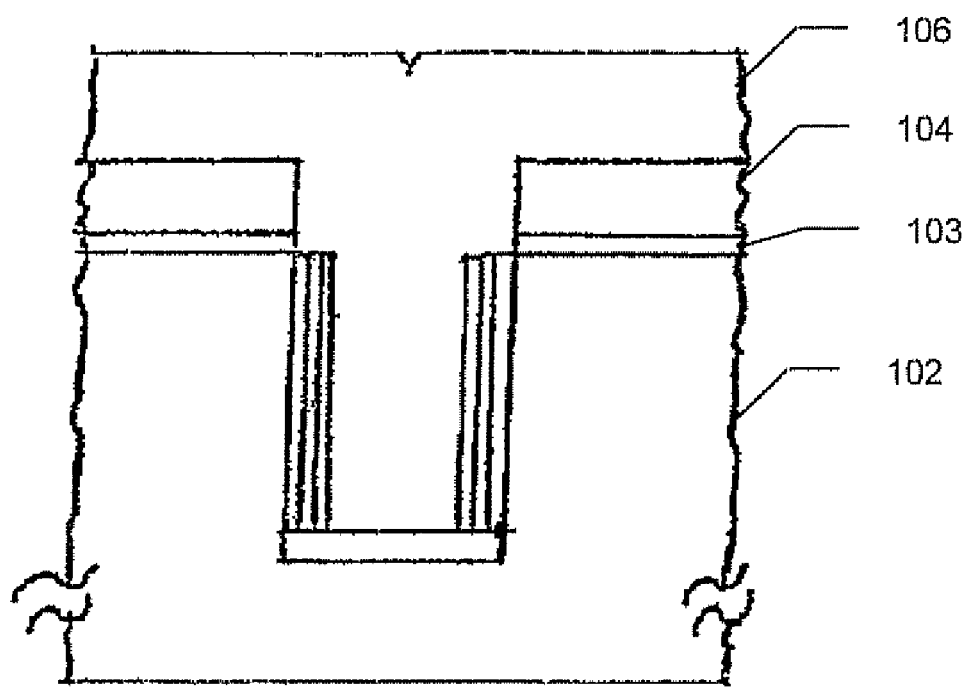
Figure 10E:
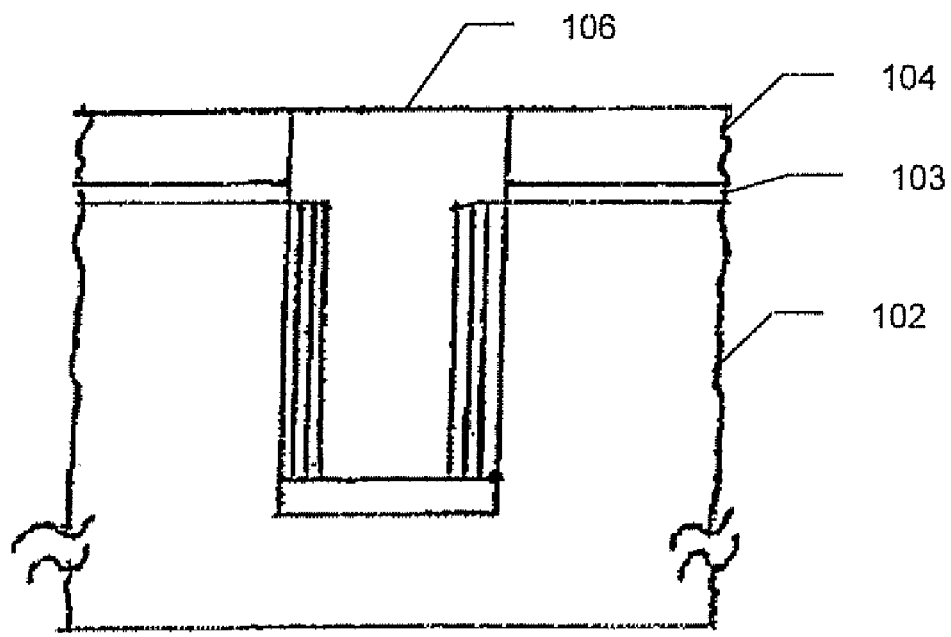
Figure 10F:
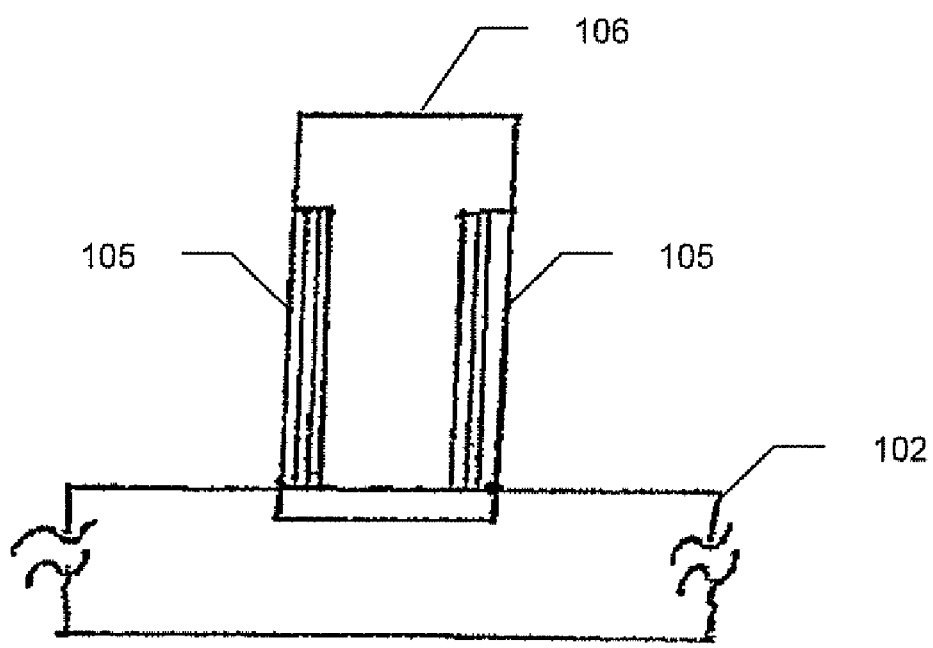
Figure 10G:
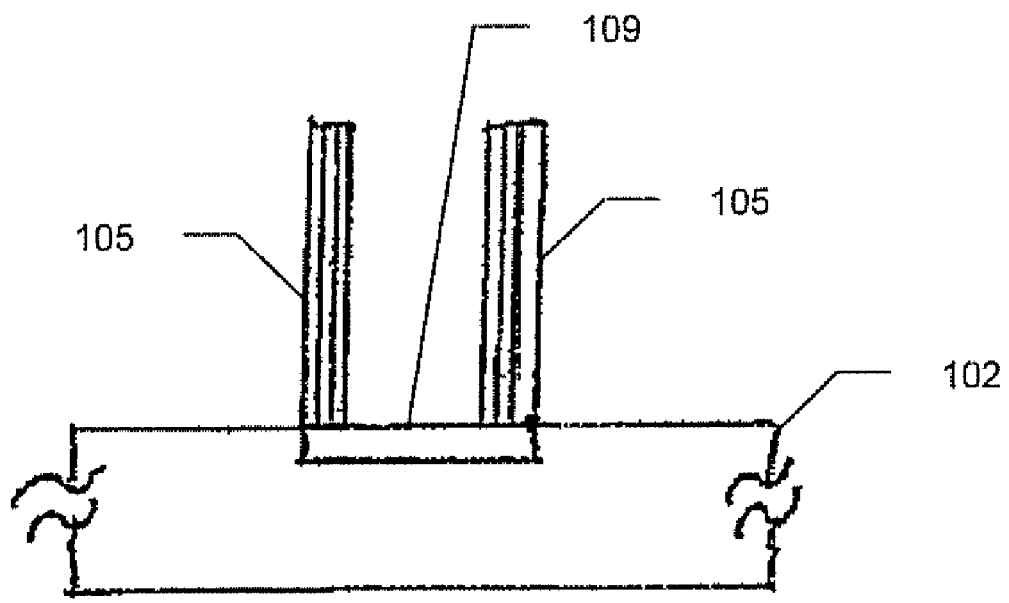
Figure 11A:
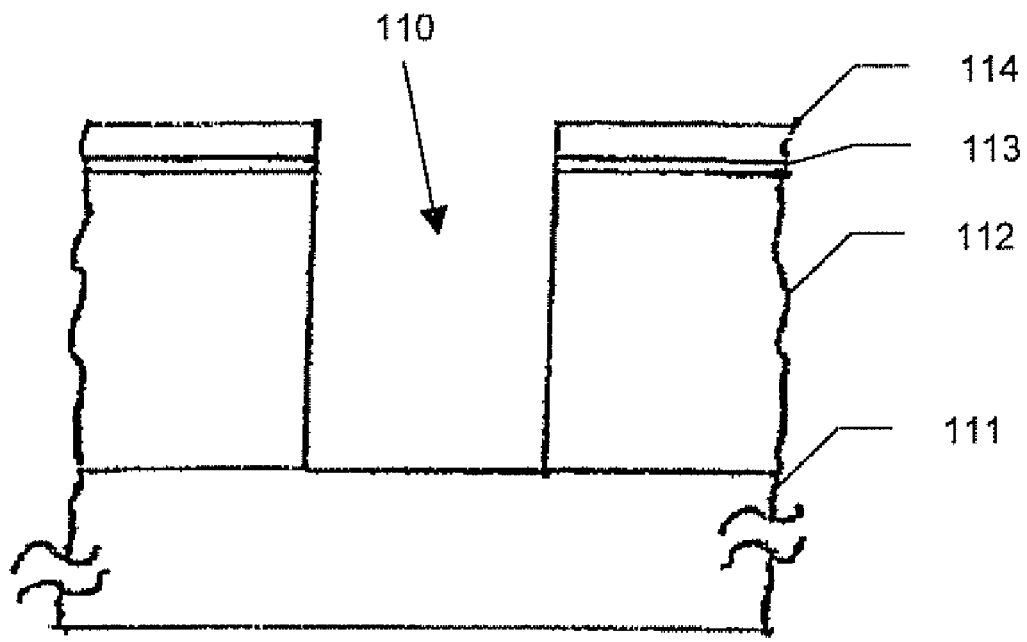
FIGS. 11A-11F are a series of cross-sectional views illustrating another method for making superlattices for use in a MEMS device in accordance with the invention.
Figure 11B:
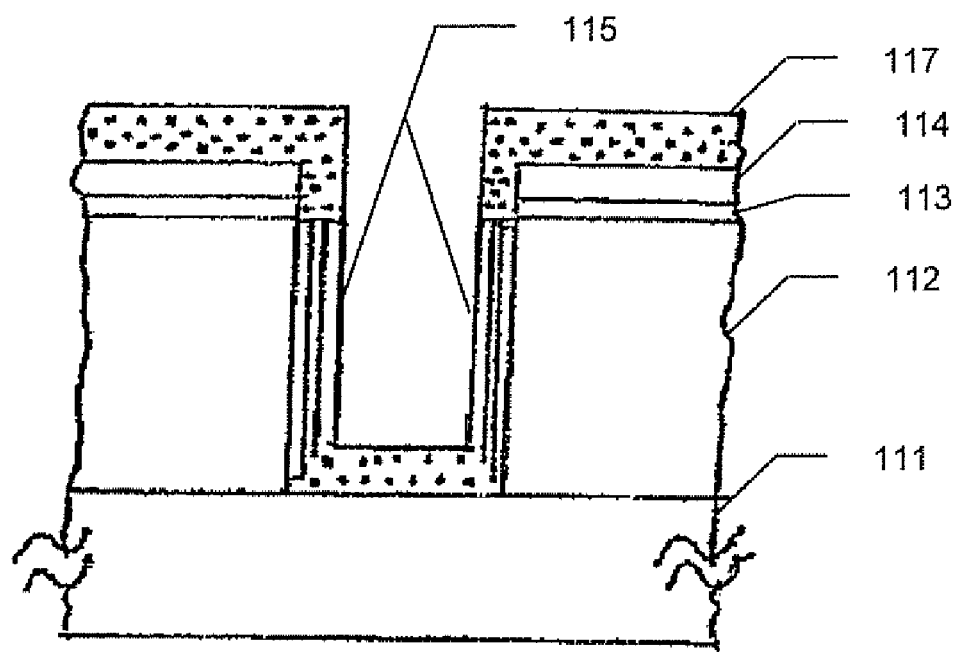
Figure 11C:
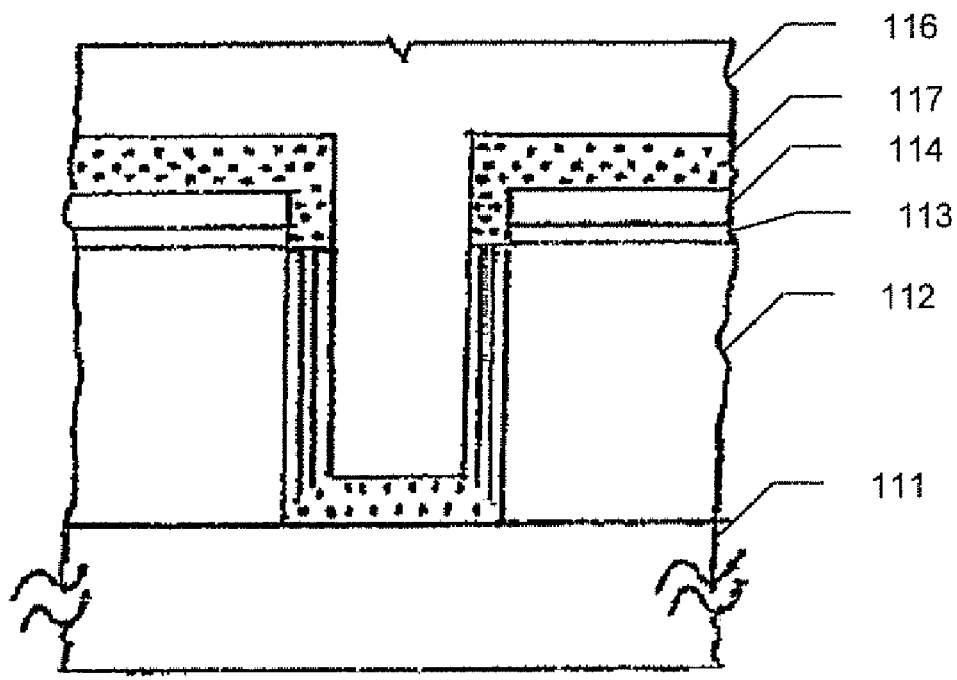
Figure 11D:
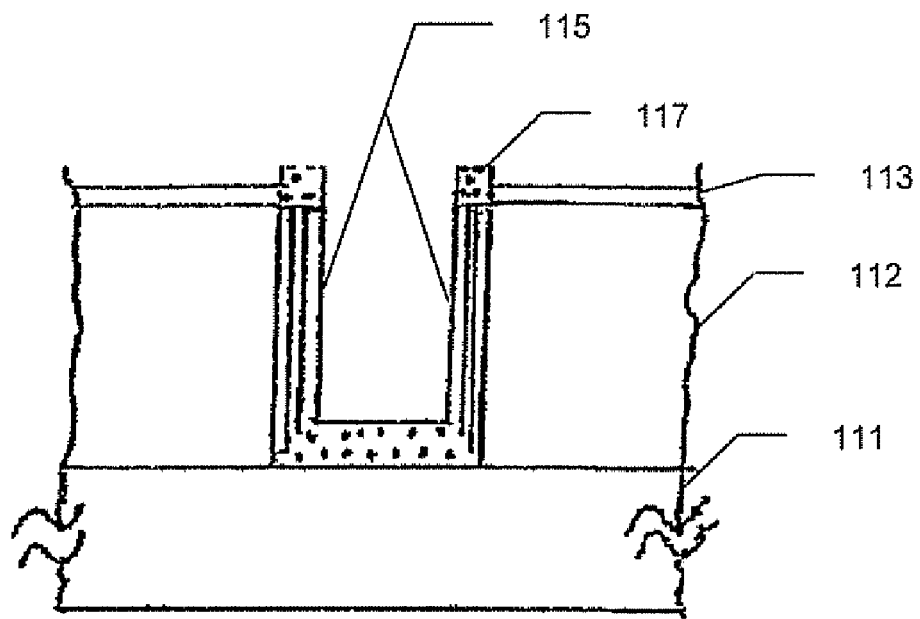
Figure 11E:
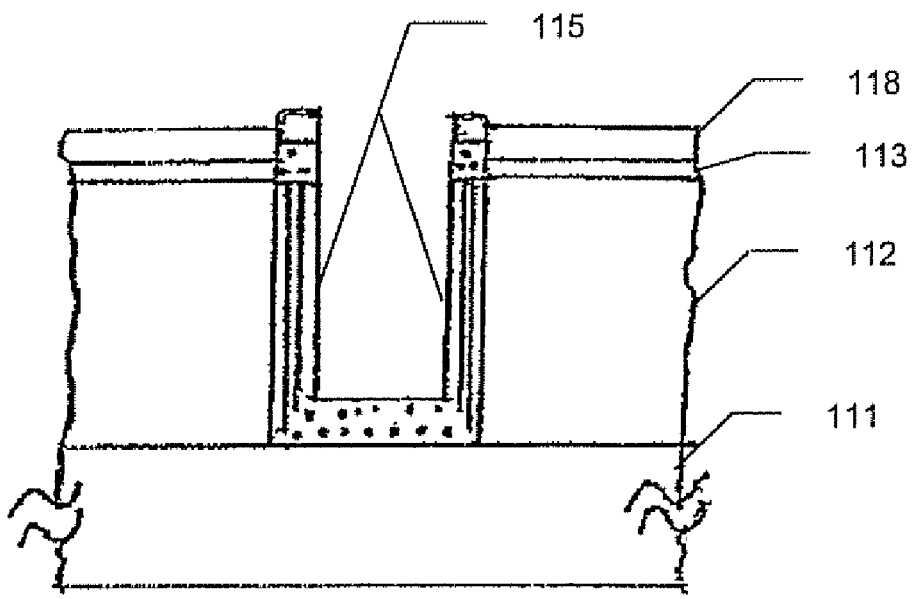
Figure 11F:
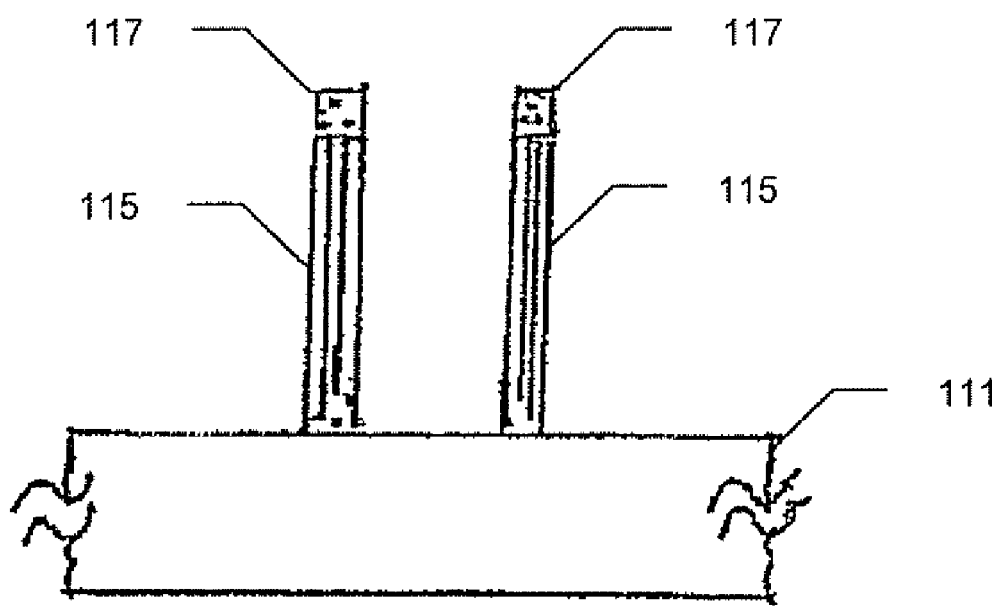
Figure 12A:
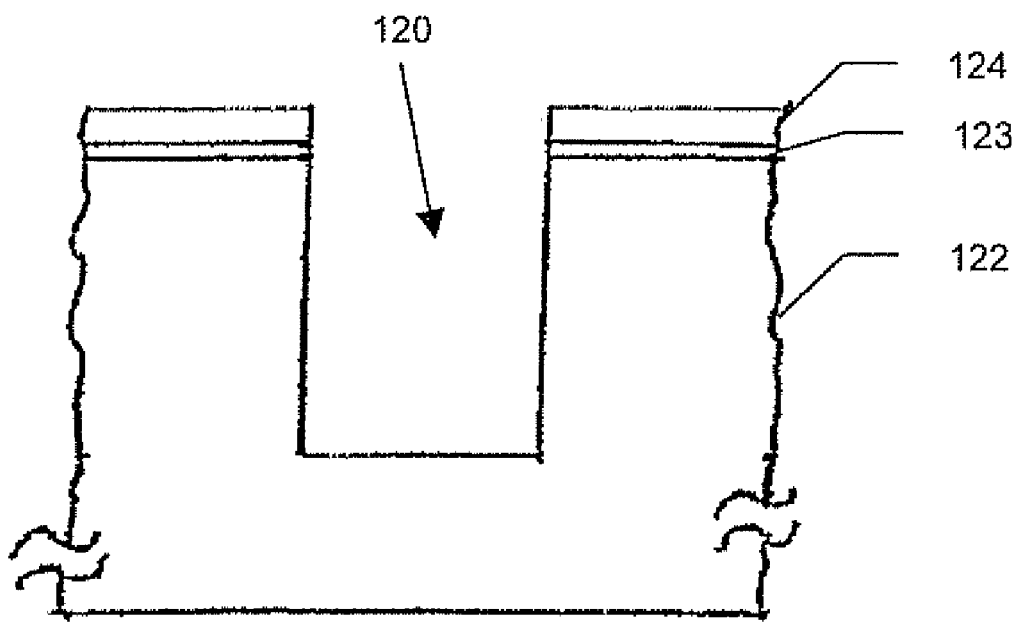
FIGS. 12A-12G are a series of cross-sectional views illustrating still another method for making superlattices for use in a MEMS device in accordance with the invention.
Figure 12B:
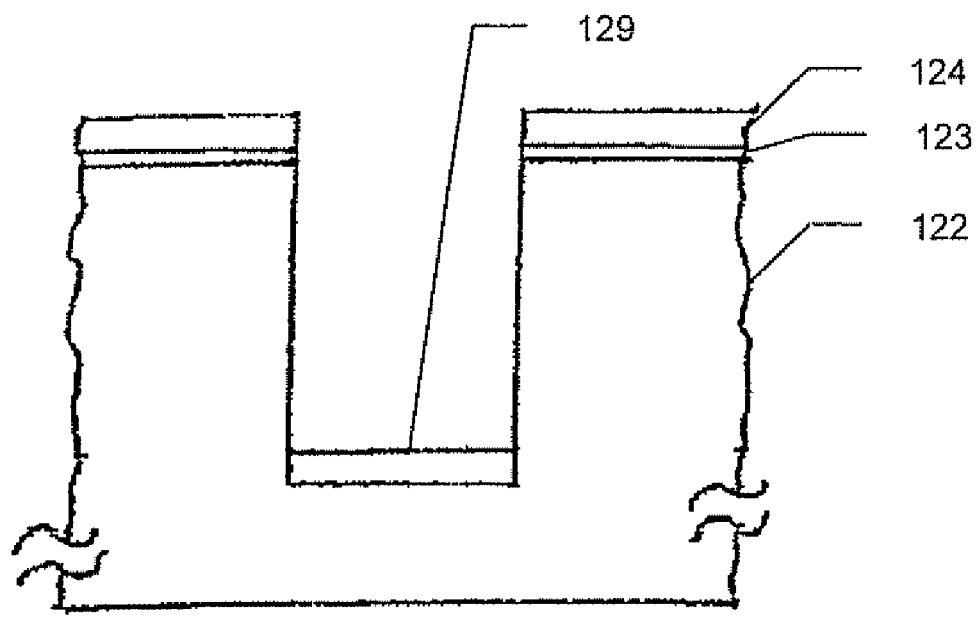
Figure 12C:
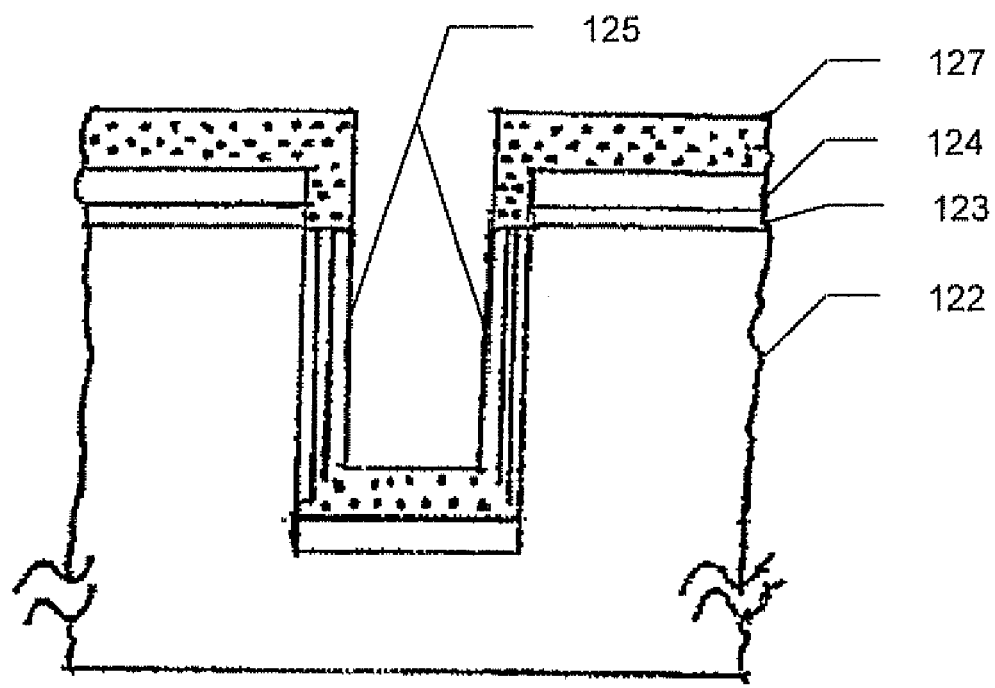
Figure 12D:
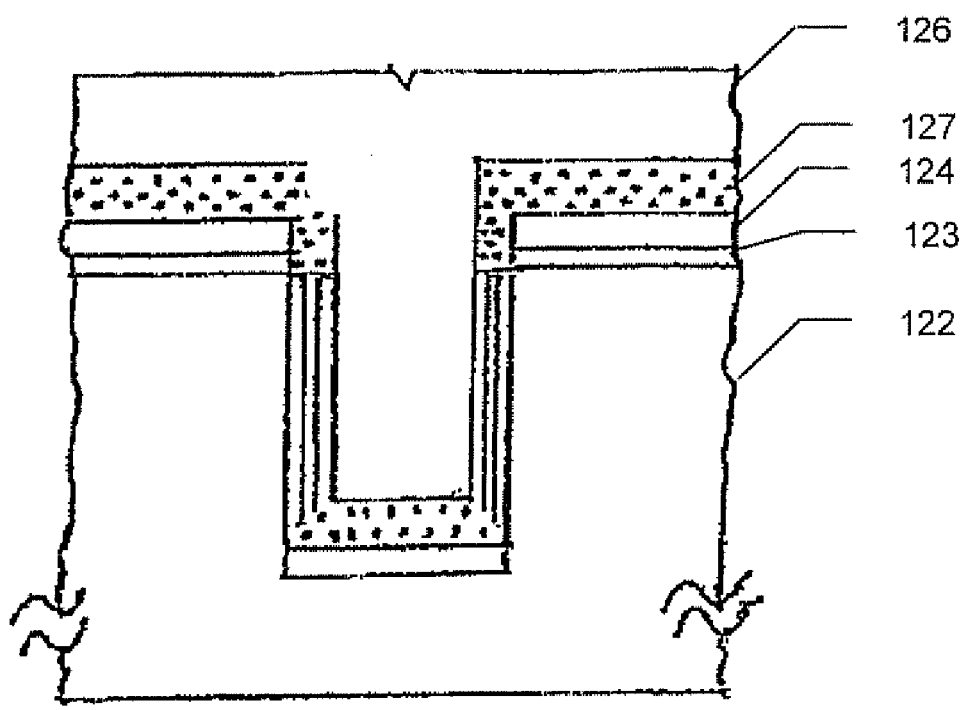
Figure 12E:
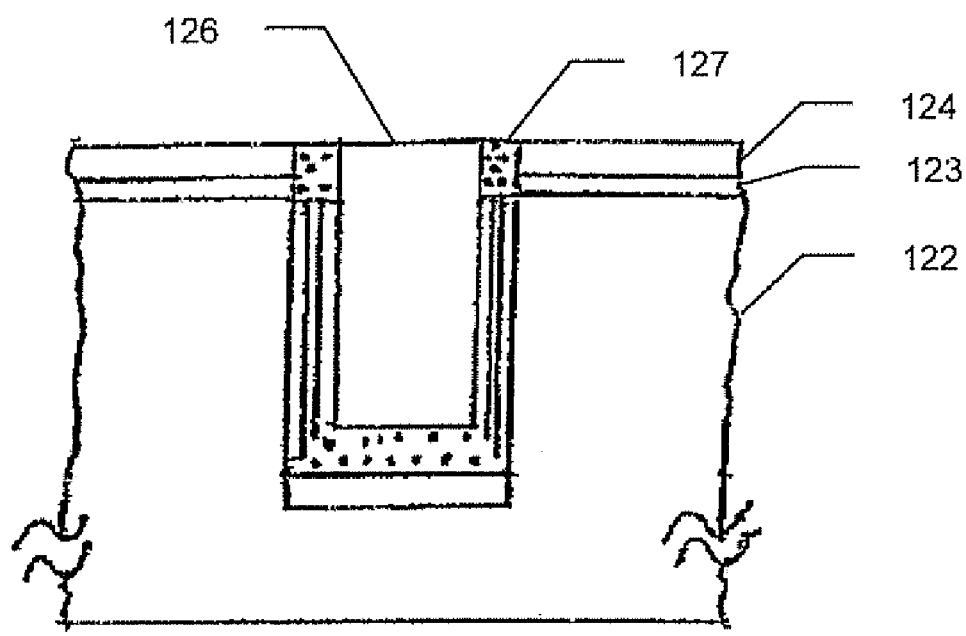
Figure 12F:
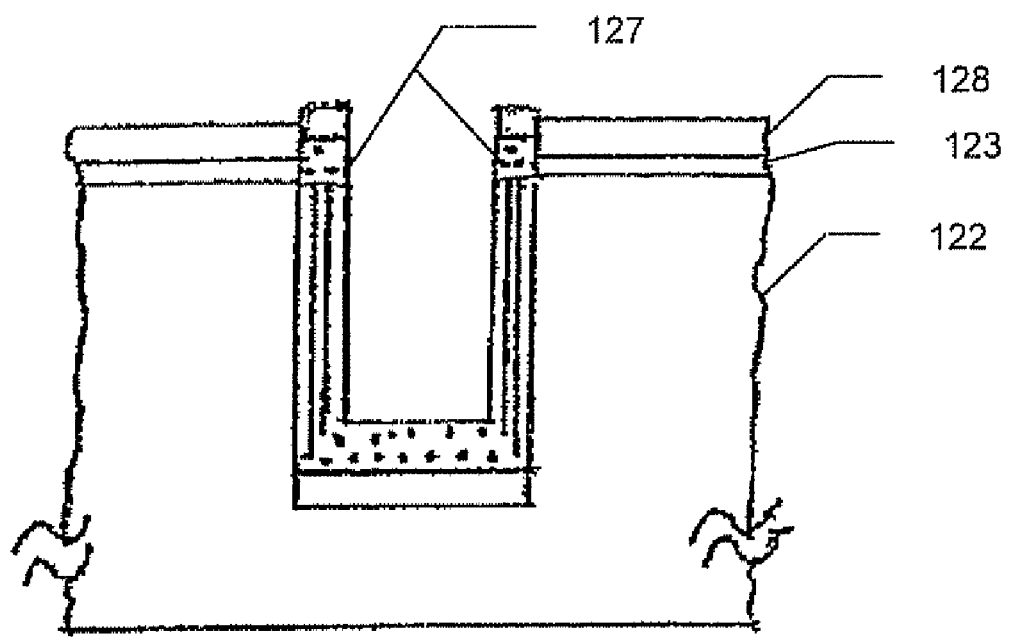
Figure 12G:
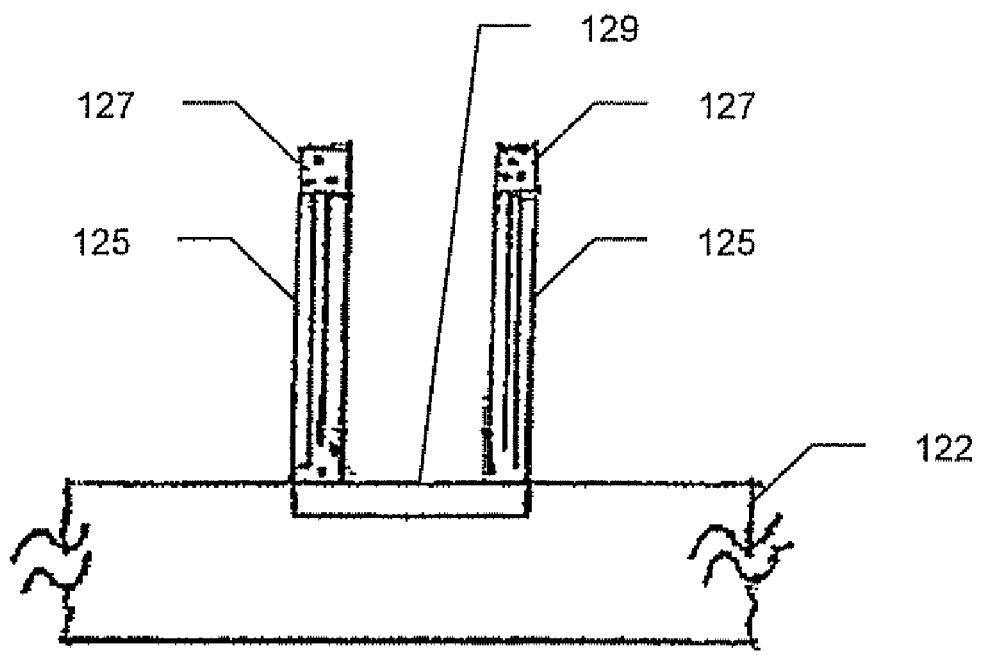

Still another process similar to the one illustrated in FIGS. 9A-9F is illustrated in FIGS. 10A-10F. This process begins with a standard semiconductor substrate 102, as opposed to an SOI substrate. The other difference is that an oxide layer (e.g., $SiO_2$) is formed in the bottom of the trench 100 prior to selective deposition of the superlattice 105 on the sidewalls of the trench (FIG. 10B). Another process illustrated in FIGS. 11A-11F is similar to the process illustrated in FIGS. 8A-8F, with the exception that the superlattice 115 is selectively deposited on the sidewalls of the trench 110, as opposed to filling the entire trench. Yet another process illustrated in FIGS. 12A-12G is similar to the process illustrated in FIGS. 10A-10G, with the exception that it incorporates polysilicon deposition as described above with reference to FIGS. 8A-8F. In all of the process sequences shown in FIGS. 9-12, a layer of silicon dioxide is present on top of the piezoelectric superlattice material before contact opening are formed.

Many modifications and other embodiments will come to the mind of one skilled in the art having the benefit of the teachings presented in the foregoing descriptions and the associated drawings. Therefore, it is understood that such modifications and embodiments are intended to be included within the scope of the appended claims.

That which is claimed is:

1. A microelectromechanical system (MEMS) device comprising:
    a substrate; and
    at least one movable member supported by said substrate and comprising a piezoelectric superlattice including a plurality of stacked groups of layers with each group of layers of said piezoelectric superlattice comprising a plurality of stacked base semiconductor monolayers defining a base semiconductor portion and at least one non-semiconductor monolayer constrained within a crystal lattice of adjacent base semiconductor portions.

2. The MEMS device of claim 1 further comprising a driver carried by said substrate for driving said at least one movable member.

3. The MEMS device of claim 1 further comprising a first electrically conductive contact carried by said at least one movable member, and a second electrically conductive contact carried by said substrate and aligned with said first electrically conductive contact.

4. The MEMS device of claim 1 further comprising a first radio frequency (RF) signal line connected to said first electrically conductive contact, and a second RF signal line connected to said second electrically conductive contact.

5. The MEMS device of claim 1 further comprising a pair of bias voltage contacts for applying a bias voltage to said superlattice for moving said at least one movable member.

6. The MEMS device of claim 1 wherein portions of said piezoelectric superlattice are spaced apart from said substrate.

7. The MEMS device of claim 1 further comprising a dielectric anchor carried by said substrate, and wherein said at least one movable member is supported by said dielectric anchor.

8. The MEMS device of claim 1 wherein said base semiconductor comprises silicon.

9. The MEMS device of claim 1 wherein said at least one non-semiconductor monolayer comprises oxygen.

10. The MEMS device of claim 1 wherein said at least one non-semiconductor monolayer comprises a non-semiconductor selected from the group consisting essentially of oxygen, nitrogen, fluorine, and carbon-oxygen.

11. The MEMS device of claim 1 wherein said at least one non-semiconductor monolayer is a single monolayer thick.

12. The MEMS device of claim 1 wherein all of said base semiconductor portions are a same number of monolayers thick.

13. The MEMS device of claim 1 wherein at least some of said base semiconductor portions are a different number of monolayers thick.

14. The MEMS device of claim 1 wherein opposing base semiconductor portions in adjacent groups of layers of said at least one piezoelectric superlattice are chemically bound together.

* * * * *